United States Patent [19]

Wang

[11] Patent Number: 5,691,722

[45] Date of Patent: Nov. 25, 1997

[54] DIRECT-DIGITIZING, SELF STABILIZING ANALOG TO DIGITAL CONVERTER

[76] Inventor: Wenwei Wang, 9004 Kennedy Dr., No. 1E, Des Plaines, Ill. 60016

[21] Appl. No.: 651,883

[22] Filed: May 21, 1996

[51] Int. Cl.$^6$ ............................................. H03M 1/38
[52] U.S. Cl. .............................. 341/161; 341/155
[58] Field of Search .............................. 341/161, 122, 341/134, 135, 151, 144, 155, 158

[56] References Cited

U.S. PATENT DOCUMENTS

| | | |
|---|---|---|
| 4,771,266 | 9/1988 | Nunokawa . |
| 5,068,662 | 11/1991 | Guddanti et al. . |
| 5,072,220 | 12/1991 | Petschacher et al. ............... 341/156 |
| 5,283,583 | 2/1994 | Ichihara . |

*Primary Examiner*—Brian K. Young
*Attorney, Agent, or Firm*—Richard C. Litman

[57] ABSTRACT

An n-bit analog to digital, (A/D), converter utilizes n comparators, and n internal digital to analog, (D/A) converters. The n D/A converters have the same full-scale output, and the same absolute accuracy in terms of voltage or current, but have n different resolutions ranging consecutively from a 1-bit D/A converter to an n-bit D/A converter. The n-bit A/D converter is divisible into n stages, ranging consecutively from a first stage containing the 1-bit D/A converter and a first comparator, to an n-th stage containing the n-bit D/A converter and an n-th comparator. The least significant bit input terminal of each D/A converter is connected to a logic high level. In each stage, an analog input signal is compared with a reference provided by a D/A converter.

21 Claims, 15 Drawing Sheets

DIRECT-DIGITIZING, SELF STABILIZING ANALOG TO DIGITAL CONVERTER

BACKGROUND OF THE INVENTION

1. Field of the Invention

The present invention relates to an n-bit analog to digital, (A/D), converter, (ADC).

2. Description of the Prior Art

Several different types of general-purpose A/D converters are known. U.S. Pat. No. 5,068,662, (Guddanti et al.) discloses a neural network analog to digital converter. U.S. Pat. No. 5,283,583, (Ichihara) discloses an analog to digital converter using a series of one-bit stages.

The most widely used general-purpose A/D converters are successive approximation A/D converters. One such converter is disclosed by U.S. Pat. No. 4,771,266, (Nunokawa). A successive approximation A/D converter has a relatively faster conversion rate than an integrating A/D converter, while having a relatively higher accuracy and a lower cost than a parallel (flash) A/D converter. There are so many intrinsic weaknesses in a conventional successive approximation A/D converter that further improvement on its conversion rate, (with the same accuracy), relies heavily on a faster internal digital to analog, (D/A), converter, (DAC), a faster comparator, and a faster successive approximation register (SAR). Therefore improvements are very limited and very costly.

To understand how a conventional successive approximation A/D converter operates, a 6-bit successive approximation A/D converter is explained as an example. A simplified block diagram of a 6-bit successive approximation A/D converter 900 is shown in FIG. 22, a timing diagram thereof is shown in FIG. 23, and the representation of its successive approximation process is shown in FIG. 24. Referring to FIG. 22, a SAR 904 is used to produce estimations of an input voltage at 907, beginning with half of the full-scale output, i.e., $V_{FS}/2$, and working down to $V_{FS}/2^6$, one bit position at a time. The output $V_{out}$ at 915 of an internal DAC 905 is compared with an analog input $V_{in}$ at 907 after each internal state change. $V_{out}$ is given by:

$$V_{out} = V_{FS} \left( \frac{B_1}{2} + \frac{B_2}{2^2} + \frac{B_3}{2^3} + \frac{B_4}{2^4} + \frac{B_5}{2^5} + \frac{B_6}{2^6} \right) \quad \text{equation 1}$$

where B1, B2, B3, B4, B5, and B6 are equal to 1 or 0; and B1=Q1, B2=Q2, B3=Q3, B4=Q4, B5=Q5, B6=Q6 therefore, $$V_{out} = V_{FS} \left( \frac{Q_1}{2} + \frac{Q_2}{2^2} + \frac{Q_3}{2^3} + \frac{Q_4}{2^4} + \frac{Q_5}{2^5} + \frac{Q_6}{2^6} \right) \quad \text{equation 2}$$

If the setting of a particular bit results in $V_{in} < V_{out}$ then that bit is latched low; otherwise, if $V_{in} > V_{out}$, that bit is latched high.

The following steps explain the A/D conversion process and related algorithm. Assuming that the DAC 905 has a $V_{FS}$=10.00 V, and an input signal $V_{in}$=5.85 V is applied, the operation is as follows:

STEP 0.) The $\overline{\text{START}}$ signal input at 906 is pulsed low, the SAR 904 is reset and cleared (Q1=Q2=Q3=Q4=Q5=Q6=0), producing $V_{out}$=0.00 v. At this point, A/D converter 900 is initialized. The time elapsed during this initiation is $t_0$.

STEP 1.) The most-significant-bit (MSB) Q1 of the SAR 904 is set (Q1=1, Q2=Q3=Q4=Q5=Q6=0), and after a settling time, a stable $V_{out}$=5.00 V, (according to Equation 2), is produced. $V_{in} > V_{out}$ therefore, the output of the comparator 903 goes high. A control logic 902 senses this, and latches Q1 high, (Q1=1). The time elapsed during step 1 is $t_1$.

STEP 2.) The next most significant bit (Q2) is set (Q1=Q2=1, Q3=Q4=Q5=Q6=0). Again, according to Equation 2, this produces a stable $V_{out}$=7.50 V after a period of settling time. $V_{in} < V_{out}$ therefore, the output of the comparator 903 is driven low, causing the control logic 902 to clear Q2 (Q2=0). The time elapsed during step 2 is $t_2$.

STEP 3.) Q3 is set (Q1=1, Q2=0, Q3=1, Q4=Q5=Q6=0), and after a settling time, a stable $V_{out}$=6.25 V is produced. $V_{in} < V_{out}$ therefore, Q3 is cleared. The time elapsed during step 3 is $t_3$.

STEP 4.) Q4 is set (Q1=1, Q2=Q3=0, Q4=1, Q5=Q6=0), and after a settling time, a stable $V_{out}$=5.625 V is produced. $V_{in} > V_{out}$ therefore, Q4 is latched high. The time elapsed during step 4 is $t_4$.

STEP 5.) Q5 is set (Q1=1, Q2=Q3=0, Q4=1, Q5=1, Q6=0), and after a settling time, a stable $V_{out}$=5.9375 V is produced. $V_{in} < V_{out}$ therefore, Q5 is cleared. The time elapsed during step 5 is $t_5$.

STEP 6.) The least significant bit (LSB) Q6 is set (Q1=1, Q2=Q3=0, Q4=1, Q5=0, Q6=1), and after a settling time, a stable $V_{out}$=5.78125 V is produced. $V_{in} > V_{out}$ therefore Q5 is latched high. The time elapsed during step 6 is $t_6$.

At this time, the A/D converter 900 outputs an $\overline{\text{EOC}}$ at 908, to signal the end of this round of A/D conversion, and a code word of "100101" is presented as the corresponding digital output.

From the above, for an n-bit (n is an integer) conventional successive approximation A/D converter, the total time T needed for each A/D conversion is:

$$T = t_0 + t_1 + t_2 + \ldots + t_n \quad \text{equation 3}$$

and $$t_1 = t_2 = \ldots = t_n \quad \text{equation 4}$$

where $t_0$ is the time for A/D conversion initiation; and $t_1, t_2, \ldots, t_n$ are times for steps 1 through n. These time periods are determined mainly by the settling time of the internal DAC 905, the response time of the comparator 903, and digital signal processing times in both the SAR 904 and the control logic 902.

The instant invention is essentially a new kind of successive approximation A/D converter. While its basic structure can be evolved from part of a conventional successive approximation A/D converter, it eliminates the need for a complex SAR, a complex control logic, and a clock. In addition to possessing all the advantages a conventional successive approximation A/D converter has, the invention acquires an additional major advantage of performing A/D conversion much faster (with the same accuracy) based on the same kind of internal D/A converters, and the same kind of comparators.

None of the above patents and prior art, taken either singly or in combination, is seen to describe the instant invention as claimed.

SUMMARY OF THE INVENTION

The operational principles of this invention, are best described using the functional diagram of a 6-bit direct-digitizing, self-stabilizing (DDSS) A/D converter as illustrated in FIG. 3. A 6-bit DDSS A/D converter 300 includes 6 identical internal 6-bit DACs, and 6 identical comparators. The full-scale output voltage of any of the 6 DACs is equal to the full-scale range of the 6-bit DDSS A/D converter 300.

The output terminal of each DAC is connected to the inverting input terminal of a corresponding comparator: DAC 313 to comparator 301; DAC 314 to comparator 302; DAC 315 to comparator 303; DAC 316 to comparator 304; DAC 317 to comparator 305; and DAC 318 to comparator 306. There is a terminal 361 for receiving an analog input $V_{in}$ which is connected to the non-inverting input terminal of each comparator. Output terminal 307 of comparator 301 is connected to every input terminal B1, (331, 337, 343, 349, 355), of DACs 314, 315, 316, 317, and 318; and its stable output (binary output, 1 or 0), is provided at terminal 367 as bit D1 (MSB) of an A/D conversion. Output terminal 308 of comparator 302 is connected to every input terminal B2, (338, 344, 350, 356), of the DACs 315, 316, 317, and 318; and its stable binary output is provided at terminal 366 as bit D2 of the A/D conversion. Output terminal 309 of comparator 303 is connected to every input terminal B3, (345, 351, 357), of the DACs 316, 317, and 318; and its stable binary output is provided at 365 as bit D3 of the A/D conversion. Output terminal 310 of comparator 304 is connected to every input terminal B4, (352, 358), of the DACs 317 and 318; and its stable binary output is provided at 364 as bit D4 of the A/D conversion. Output terminal 311 of comparator 305 is connected to the input terminal B5 (359) of the DAC 318; and its stable binary output is provided at 363 as bit D5 of the A/D conversion. Output terminal 312 of comparator 306 is not connected to any DAC; and its stable binary output is provided at 362 as bit D6 (LSB) of the A/D conversion.

In the DAC 313, input terminal B1, (325), is connected to a constant logic high level (denoted as "H"); while other input terminals B2–B6, (326–330), are connected to a constant logic low level (denoted as "L"). In the DAC 314, input terminal B2, (332), is connected to a "H"; while input terminals B3–B6, (333–336), are connected to a "L". In the DAC 315, input terminal B3, (339), is connected to a "H"; while input terminals B4, B5 and B6, (340, 341 and 342), are connected to a "L". In the DAC 316, input terminal B4, (346), is connected to a "H", while input terminals B5 and B6, (347 and 348), are connected to a "L". In the DAC 317, input terminal B5, (353), is connected to a "H", while input terminal B6, (354), is connected to a "L". In the DAC 318, input terminal B6, (360), is connected to a "H".

The conversion process and related algorithm of an DDSS A/D converter are similar to those of a conventional successive approximation A/D converter. Referring to FIG. 3, after an analog input $V_{in}$ is applied at 361, an A/D conversion goes step by step as the following:

STEP. 1) The DAC 313 always provides a constant output $V_{out1}$, at 319, for the comparator 301. $V_{out1}$ can be expressed by:

$$V_{out1} = \qquad \text{Equation 5}$$

$$V_{FS}\left(\frac{1}{2} \times 1 + \frac{1}{2^2} \times 0 + \frac{1}{2^3} \times 0 + \frac{1}{2^4} \times 0 + \frac{1}{2^5} \times 0 + \frac{1}{2^6} \times 0\right) = \frac{V_{FS}}{2}$$

$V_{in}$ is then compared with $V_{out1}$. If $V_{in} > V_{out1}$, then a stable comparator output D1=1 is produced; if $V_{in} < V_{out1}$, D1=0.

STEP. 2) The output $V_{out2}$ at 320 of the DAC 314 is determined by comparator output D1. $V_{out2}$ can be expressed by:

$$V_{out2} = \qquad \text{Equation 6}$$

$$V_{FS}\left(\frac{1}{2} \times D_1 + \frac{1}{2^2} \times 1 + \frac{1}{2^3} \times 0 + \frac{1}{2^4} \times 0 + \frac{1}{2^5} \times 0 + \frac{1}{2^6} \times 0\right) =$$

$$V_{FS}\left(\frac{D_1}{2} + \frac{1}{2^2}\right)$$

$V_{out2}$ is stable after D1 is stable. If $V_{in} > V_{out2}$, a stable D2=1 is produced; if $V_{in} < V_{out2}$, D2=0.

STEP. 3) The output $V_{out3}$ at 321 of the DAC 315 is determined by comparator outputs D1 and D2. $V_{out3}$ can be expressed by:

$$V_{out3} \qquad \text{Equation 7}$$

$$= V_{FS}\left(\frac{1}{2} \times D_1 + \frac{1}{2^2} \times D_2 + \frac{1}{2^3} \times 1 + \frac{1}{2^4} \times 0 + \frac{1}{2^5} \times 0 + \frac{1}{2^6} \times 0\right)$$

$$= V_{FS}\left(\frac{D_1}{2} + \frac{D_2}{2^2} + \frac{1}{2^3}\right)$$

$V_{out3}$ is stable after D2 is stable. If $V_{in} > V_{out3}$, a stable D3=1 is produced; if $V_{in} < V_{out3}$, D3=0.

STEP. 4) The output $V_{out4}$ at 322 of the DAC 316 is determined by comparator outputs D1, D2, and D3. $V_{out4}$ can be expressed by:

$$V_{out4} \qquad \text{Equation 8}$$

$$= V_{FS}\left(\frac{1}{2} \times D_1 + \frac{1}{2^2} \times D_2 + \frac{1}{2^3} \times D_3 + \frac{1}{2^4} \times 1 + \frac{1}{2^5} \times 0 + \frac{1}{2^6} \times 0\right)$$

$$= V_{FS}\left(\frac{D_1}{2} + \frac{D_2}{2^2} + \frac{D_3}{2^3} + \frac{1}{2^4}\right)$$

$V_{out4}$ is stable after D3 is stable. If $V_{in} > V_{out4}$, a stable D4=1 is produced; if $V_{in} < V_{out4}$, D4=0.

STEP. 5) The output $V_{out5}$ at 323 of the DAC 317 is determined by comparator outputs D1, D2, D3, and D4. $V_{out5}$ can be expressed by:

$$V_{out5} \qquad \text{Equation 9}$$

$$= V_{FS}\left(\frac{1}{2} \times D_1 + \frac{1}{2^2} \times D_2 + \frac{1}{2^3} \times D_3 + \frac{1}{2^4} \times D_4 + \frac{1}{2^5} \times 1 + \frac{1}{2^6} \times 0\right)$$

$$= V_{FS}\left(\frac{D_1}{2} + \frac{D_2}{2^2} + \frac{D_3}{2^3} + \frac{D_4}{2^4} + \frac{1}{2^5}\right)$$

$V_{out5}$ is stable after D4 is stable. If $V_{in} > V_{out5}$, a stable D5=1 is produced; if $V_{in} < V_{out5}$, D5=0.

STEP. 6) The output $V_{out6}$ at 324 of the DAC 318 is determined by comparator outputs D1, D2, D3, D4, and D5. $V_{out6}$ can be expressed by:

$$V_{out6} \qquad \text{Equation 10}$$

$$= V_{FS}\left(\frac{1}{2} \times D_1 + \frac{1}{2^2} \times D_2 + \frac{1}{2^3} \times D_3 + \frac{1}{2^4} \times D_4 + \frac{1}{2^5} \times D_5 + \frac{1}{2^6} \times 1\right)$$

$$= V_{FS}\left(\frac{D_1}{2} + \frac{D_2}{2^2} + \frac{D_3}{2^3} + \frac{D_4}{2^4} + \frac{D_5}{2^5} + \frac{1}{2^6}\right)$$

$V_{out6}$ is stable after D5 is stable. If $V_{in} > V_{out6}$, a stable D6=1 is produced; if $V_{in} < V_{out6}$, D6=0. At this point, this round of A/D conversion is completed, and a stable A/D conversion output code word becomes available.

The 6 conversion steps can be summarized in a flow chart as illustrated in FIG. 4. The total time T for each A/D conversion can be expressed as:

$$T = T_{301} + T_{314} + T_{302} + T_{315} + T_{303} + T_{316} + T_{304} + \\ T_{317} + T_{305} + T_{318} + T_{306}$$  Equation 11

Wherein $T_{301}$ is the response time of the comparator 301, $T_{314}$ is the settling time of the DAC 314, and so forth. Depending on the relationship between a new input signal and a last one, some of the small intervals in Equation 11 are skipped, so the total conversion time T varies considerably. This is explained as follows.

For convenience of analysis, we assume that the response time of every comparator (denoted as $T_{COMP}$) is constant and is always the same, that the settling time of every DAC (denoted as $T_{DAC}$) is constant and is always the same, and that there is no over-shooting at the output of any DAC. With these assumptions, there are 7 cases with respect to A/D conversion time T:

CASE 1.) $T=6T_{COMP}+5T_{DAC}$

Refer to FIG. 3 and to the timing diagram in FIG. 5. Assuming that the A/D conversion output code word of a last analog input is "100010", and that a new analog input equivalent to a code word of "010101" is applied at time 0, and starts an A/D conversion, (the 6 comparators make comparisons simultaneously). At the comparator 301, the analog input equivalent to "010101" is compared with the DAC 313 analog output equivalent to a code word of "100000", and after a $T_{COMP}$ (at time 1), a stable "0" is output from the comparator 301 as D1 (MSB), since "010101"<"100000". Also during the $T_{COMP}$ the following occurs: at the comparator 302, the input is compared with the DAC 314 output of "110000", and a transitional "0" is produced as D2 since "010101"<"110000"; at the comparator 303, the input is compared with the DAC 315 output of "101000", and a transitional "0" is produced as D3 since "010101"<"101000"; at the comparator 304, the input is compared with the DAC 316 output of "100100", and a transitional "0" is produced as D4 since "010101"<"100100"; at the comparator 305, the input is compared with the DAC 317 output of "100010", and a transitional "0" is produced as D5 since "010101"<"100010"; and at the comparator 306, the input "010101" is compared with the DAC 318 output of "100011", and a transitional "0" is produced as D6 (LSB) since "010101"<"100011".

So at time 1, the transitional A/D conversion output code word is "000000", which determines the outputs of DACs 314, 315, 316, 317, and 318 after a settling time of $T_{DAC}$, then: at the comparator 302, the input "010101" is compared with the DAC 314 output of "010000", and after a $T_{COMP}$, a stable "1" is produced as D2 since "010101">"010000". Also during the $T_{COMP}$ the following occurs: at the comparator 303, the input is compared with the DAC 315 output of "001000", and a transitional "1" is produced as D3 since "010101">"001000"; at the comparator 304, the input is compared with the DAC 316 output of "000100", and a transitional "1" is produced as D4 since "010101">"000100"; at the comparator 305, the input is compared with the DAC 317 output of "000010", and a transitional "1" is produced as D5 since "010101">"000010"; and at the comparator 306, the input is compared with the DAC 318 output of "000001", and a transitional "1" is produced as D6 since "010101">"000001".

So at time 2, the transitional A/D conversion output code word is "011111", which determines the outputs of DACs 315, 316, 317, and 318 after a $T_{DAC}$, then: at the comparator 303, the input "010101" is compared with the DAC 315 output of "011000", and after a $T_{COMP}$, a stable "0" is produced as D3 since "010101"<"011000". Also during the $T_{COMP}$ the following occurs: at the comparator 304, the input is compared with the DAC 316 output of "011100", and a transitional "0" is produced as D4 since "010101"<"011100"; at the comparator 305, the input is compared with the DAC 317 output of "011110", and a transitional "0" is produced as D5 since "010101"<"011110"; and at the comparator 306, the input is compared with the DAC 318 output of "011111", and a transitional "0" is produced as D6 since "010101"<"011111".

So at time 3, the transitional A/D conversion output code word is "010000", which determines the outputs of the DACs 316, 317, and 318 after a $T_{DAC}$, then: at the comparator 304, the input "010101" is compared with the DAC 316 output of "010100", and after a $T_{COMP}$, a stable "1" is produced as D4 since "010101">"010100". Also during the $T_{COMP}$ the following occurs: at the comparator 305, the input is compared with the DAC 317 output of "010010", and a transitional "1" is produced as D5 since "010101">"010010"; and at the comparator 306, the input "010101" is compared with the DAC 318 output of "010001", and a transitional "1" is produced as D6 since "010101">"010001".

So at time 4, the transitional A/D conversion output code word is "010111", which determines the outputs of the DACs 317 and 318 after a $T_{DAC}$, then: at the comparator 305, the input "010101" is compared with the DAC 317 output of "010110", and after a $T_{COMP}$, a stable "0" is produced as D5 since "010101"<"010110". Also during the $T_{COMP}$, at the comparator 306, the input is compared with the DAC 318 output of "010111", and a transitional "0" is produced as D6 since "010101"<"010111".

So at time 5, the transitional A/D conversion output code word is "010100", which determines the output of the DAC 318 after a $T_{DAC}$; then at the comparator 306, the input "010101" is compared with the DAC 318 output of "010101", and after a $T_{COMP}$, at time 6, a stable "1" is produced as D6 (LSB), because the input must be greater than the absolute value of "010101" by less than one LSB to get a final A/D conversion output of "010101".

From the above, the total conversion time T for this case is $(6T_{COMP}+5T_{DAC})$.

CASE 2.) $T=5T_{COMP}+4T_{DAC}$

Refer to FIG. 6. Assuming that the output code word for a last analog input is "011001", and that a new input equivalent to a code word of "101101" is applied at time 0. Then: after a $T_{COMP}$, at time 1, a transitional code word of "111111" is produced; after a $(T_{COMP}+T_{DAC})$, at time 2, a transitional code word of "100000" is produced; after another $(T_{COMP}+TD_{DAC})$, at time 3, a transitional code word of "101111" is produced; after still another $(T_{COMP}+T_{DAC})$, at time 4, a transitional code word of "101100" is produced; after still another $(T_{COMP}+T_{DAC})$, at time 5, a final and stable code word of "101101" is produced, which completes this A/D conversion. From the above, the total conversion time for this case is $(5T_{COMP}+4T_{DAC})$.

CASE 3.) $T=4T_{COMP}+3T_{DAC}$

Refer to FIG. 7. Assuming that the output code word for a last analog input is "100100", and that a new analog input equivalent to a code word of "111010" is applied at time 0. Then: after a $T_{COMP}$, at time 1, a transitional code word of "111111" is produced; after a $(T_{COMP}+T_{DAC})$, at time 2, a transitional code word of "111000" is produced; after another $(T_{COMP}+T_{DAC})$, at time 3, a transitional code word of "111011" is produced; after still another $(T_{COMP}+T_{DAC})$, at time 4, a final and stable code word of "111010" is produced, which completes this A/D conversion. From the above, the total conversion time for this case is $(4T_{COMP}+3T_{DAC})$.

CASE 4.) $T=3T_{COMP}+2T_{DAC}$

Refer to FIG. 8. Assuming that the output code word for a last analog input is "010011", and that a new analog input equivalent to a code word of "001110" is applied at time 0. Then: after a $T_{COMP}$, at time 1, a transitional code word of "000000" is produced; after a $(T_{COMP}+T_{DAC})$, at time 2, a transitional code word of "001111" is produced; after another $(T_{COMP}+T_{DAC})$, at time 3, a final and stable code word of "001110" is produced, which completes this A/D conversion. From the above, the total conversion time for this case is $(3T_{COMP}+2T_{DAC})$.

CASE 5.) $T=2T_{COMP}+T_{DAC}$

Refer to FIG. 9. Assuming that the output code word for a last analog input is "110110", and that a new analog input equivalent to a code word of "111000" is applied at time 0. Then: after a $T_{COMP}$, at time 1, a transitional code word of "111111" is produced; after a $(T_{COMP}+T_{DAC})$, at time 2, a final and stable code word of "111000" is produced, which completes this A/D conversion. From the above, the total conversion time for this case is $(2T_{COMP}+T_{DAC})$.

CASE 6.) $T=T_{COMP}$

Refer to FIG. 10. Assuming that the output code word for a last analog input is "011000", and that a new analog input equivalent to a code word of "011001" is applied at time 0. Then: after only a $T_{COMP}$, at time 1, a final and stable code word of "011001" is produced, which completes this A/D conversion. From the above, the total conversion time for this case is only $T_{COMP}$.

CASE 7.) T=0

Refer to FIG. 11. Assuming that the output code word for a last analog input is "101101", and that a new analog input also equivalent to a code word of "101101" is applied at time 0. Then: the status of all the comparators and all the DACs remain unchanged. No A/D conversion operations are needed and therefore, the total conversion time for this case is 0.

The above analysis is based on the assumption that there is no overshooting at any DAC output. However, when there is overshooting at the output of an DAC, the comparator for which the DAC provides voltage reference produces transitional unstable output, so do the subsequent comparators; but when the overshooting is diminished, the outputs of these comparators become stable again at the same time. The only effect of overshooting is causing some time delay to an A/D conversion.

Accordingly, it is an object of the invention to provide an analog to digital converter without an complex SAR or complex control logic, thereby eliminating time needed for SAR and control logic operations.

It is another object of the invention to sense the end of each A/D conversion, and thereby save considerable time on a series of continuous A/D conversions by exploiting the varying-conversion-rate characteristic of an DDSS A/D converter.

It is a further object of the invention to perform dynamic A/D conversion as opposed to static conversion as preformed by a conventional successive approximation A/D converter. Referring to Equation 3 and Equation 4, in a conventional successive approximation A/D converter, to get a reliable comparator output, the output of the internal DAC should have enough time to settle to within a definite band of error. The lengths of the intervals t1, t2, t3, t4, t5, and t6 are preset based on the most unfavorable conditions, under which the settling time of an internal DAC is the longest, and the response of a comparator is the slowest. For easy control, they are usually preset identical and equal to a definite number of pulse cycles. Conversely, in an DDSS A/D converter, usually, a comparator doesn't need to wait for the output of a corresponding DAC to settle to within a definite band of error to get a reliable comparator output. Referring to FIG. 19, for the output $V_{out}$ of an DAC to settle to within an error band of $\pm\Delta\epsilon$, a settling time of $T_{DAC}$ is needed; but before time $T_{DAC}$, at time $T'_{DAC}$, $V_{out}$ reaches a value of $V_{in}$; therefore, after $T'_{DAC}$, and not necessarily $T_{DAC}$, the comparison between $V_{out}$ and $V_{in}$ becomes definite. A comparator in an DDSS A/D converter makes comparison at $T'_{DAC}$, but a comparator in a conventional successive approximation A/D converter does this only after $T_{DAC}$. Therefore, considerable conversion time can be saved when using an DDSS A/D converter because of its capability of performing dynamic comparisons.

Another object of the invention is to further increase A/D conversion rate by reducing the delay caused by the aperture and sample to hold settling time of a sample-hold (or track-hold) amplifier preceding to an DDSS A/D converter by relying on its dynamic-comparison capability. The aperture and sample to hold settling time of a sample-hold amplifier is similar to the settling time of an DAC. After a "Hold" operation begins (an A/D conversion begins at the same time), but before the output voltage of the sample-hold amplifier settles to within a definite band of error, the transitional output voltage is stable enough to produce one or several of the more significant bits of the succeeding DDSS A/D converter. Therefore, the dynamic-comparison feature of an DDSS A/D converter can also benefit its preceding sample-hold amplifier.

It is another object of the invention to reduce time delay caused by the response time of its comparators. The over-drive voltages at the inputs of comparators of an DDSS A/D converter varies during A/D conversions. Since to some extent, the more the over-drive voltage, the shorter the response time, an DDSS A/D converter spends less time in comparator operations than a conventional successive approximation A/D converter does: the latter allots for its comparator a uniform time for each comparison that is based on the slowest possible comparator response corresponding to a smallest possible over-drive voltage at comparator input.

Still another object of the invention is to eliminate the conversion initiation time, (refer to $t_0$ in Equation 3), inherent to a conventional successive approximation A/D converter. Besides, in an DDSS A/D converter, there is always a constant reference provided by an DAC to a comparator which produces the MSB of A/D conversion; and consequently, this DAC needs no settling time (as can be seen from Equation 11 that there is no $T_{313}$).

These and other objects of the present invention will become readily apparent upon further review of the following specification and drawings.

DETAILED DESCRIPTION OF THE PREFERRED EMBODIMENT(S)

Figure 3:
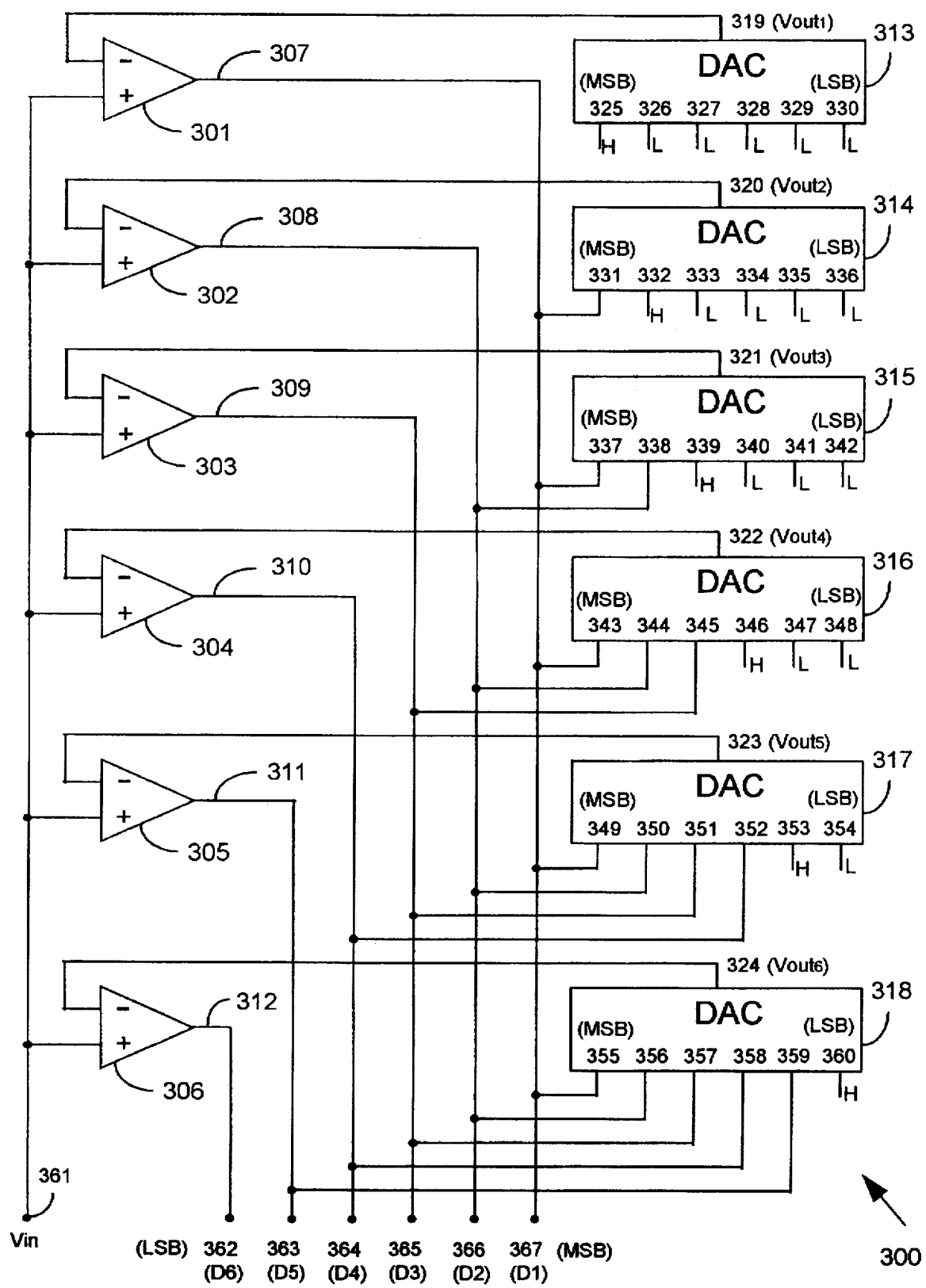
FIG. 3 is a functional diagram of a 6-bit DDSS A/D converter explaining its operational principles.
Figure 4:
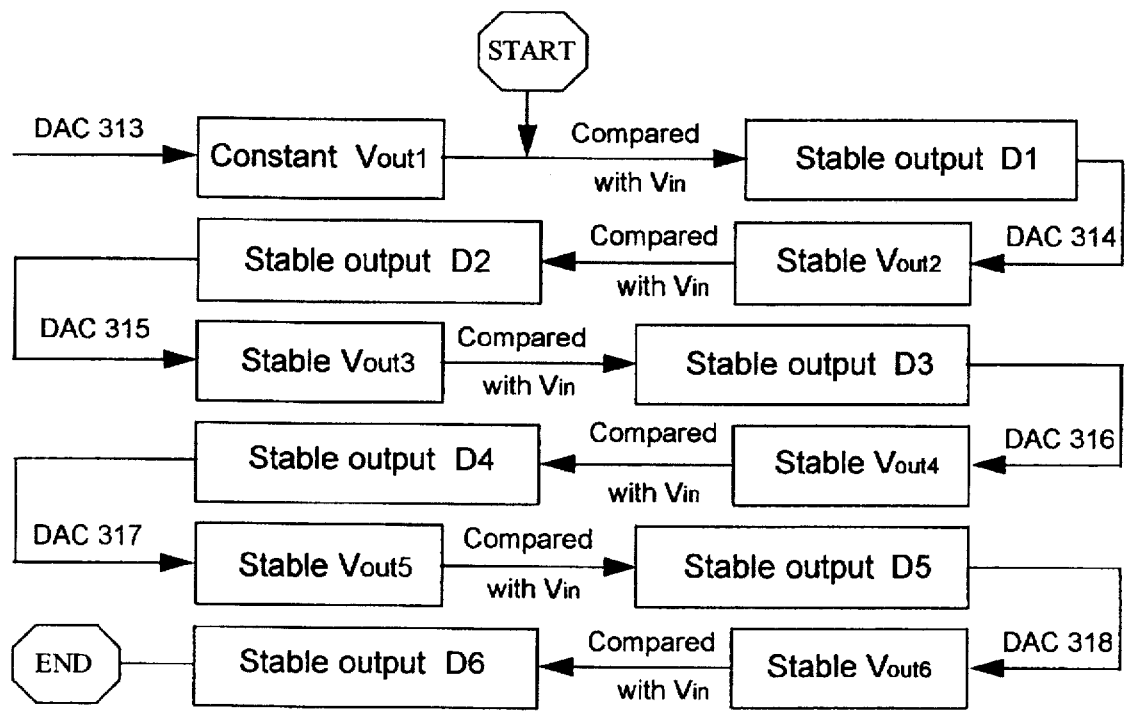
FIG. 4 is a flow chart illustrating the A/D conversion procedure of the 6-bit DDSS A/D converter shown in FIG. 3.
Figure 5:
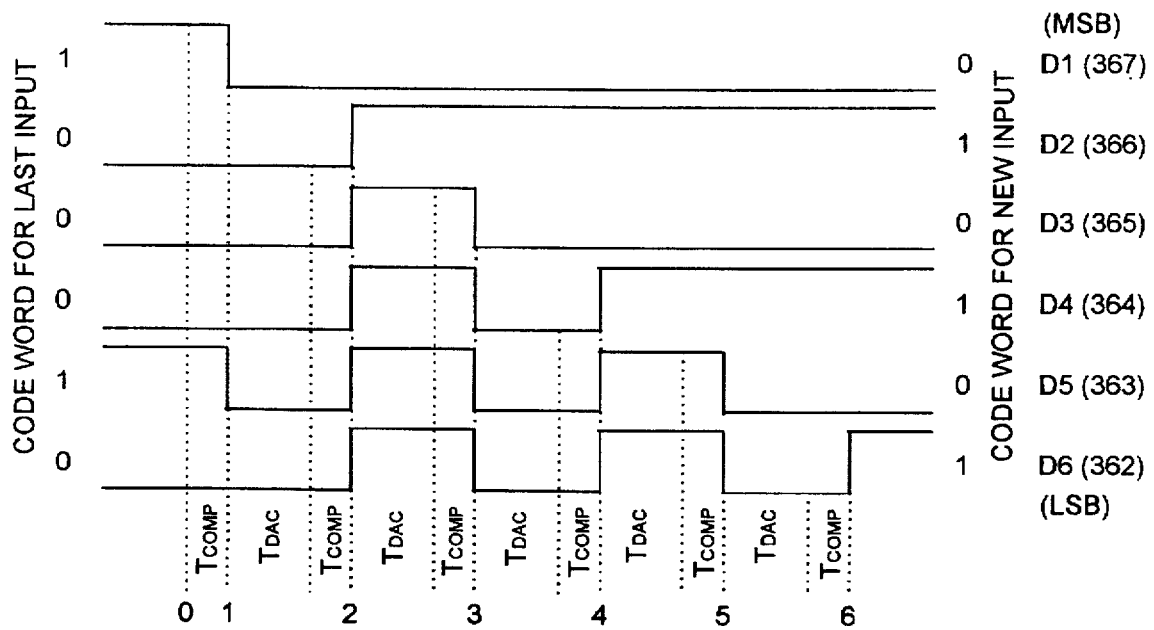
FIG. 5 is the timing diagram for the first case with respect to the varying-conversion-rate characteristic of the 6-bit DDSS A/D converter shown in FIG. 3.
Figure 6:
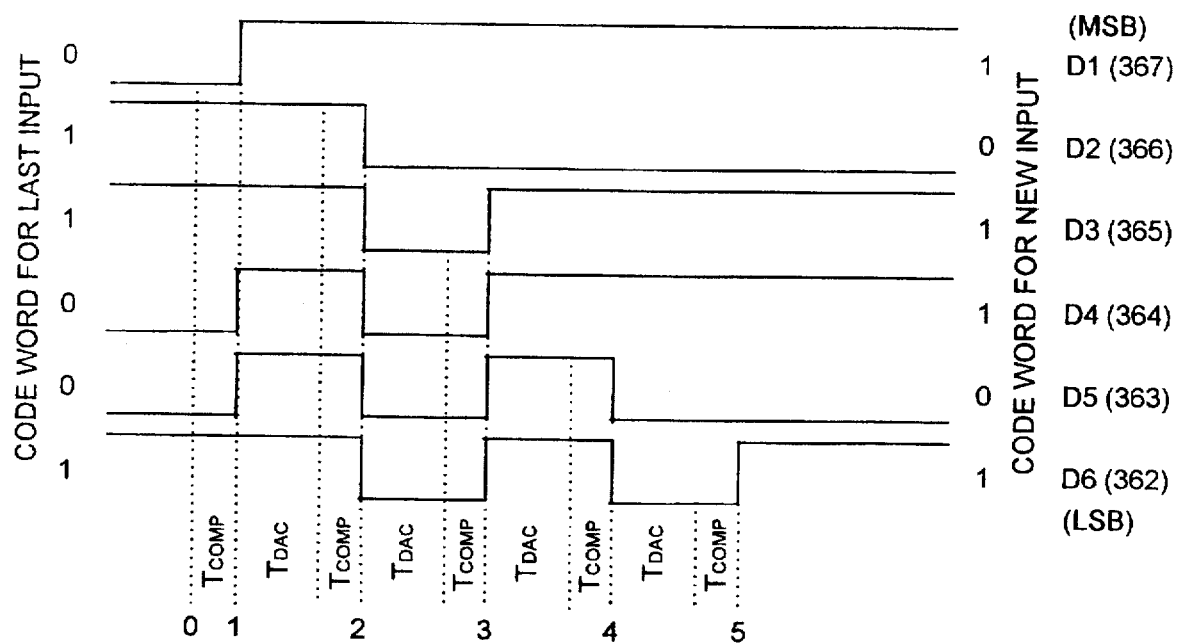
FIG. 6 is the timing diagram for the second case with respect to the varying-conversion-rate characteristic of the 6-bit DDSS A/D converter shown in FIG. 3.
Figure 7:
FIG. 7 is the timing diagram for the third case with respect to the varying-conversion-rate characteristic of the 6-bit DDSS A/D converter shown in FIG. 3.
Figure 8:
FIG. 8 is the timing diagram for the fourth case with respect to the varying-conversion-rate characteristic of the 6-bit DDSS A/D converter shown in FIG. 3.
Figure 9:
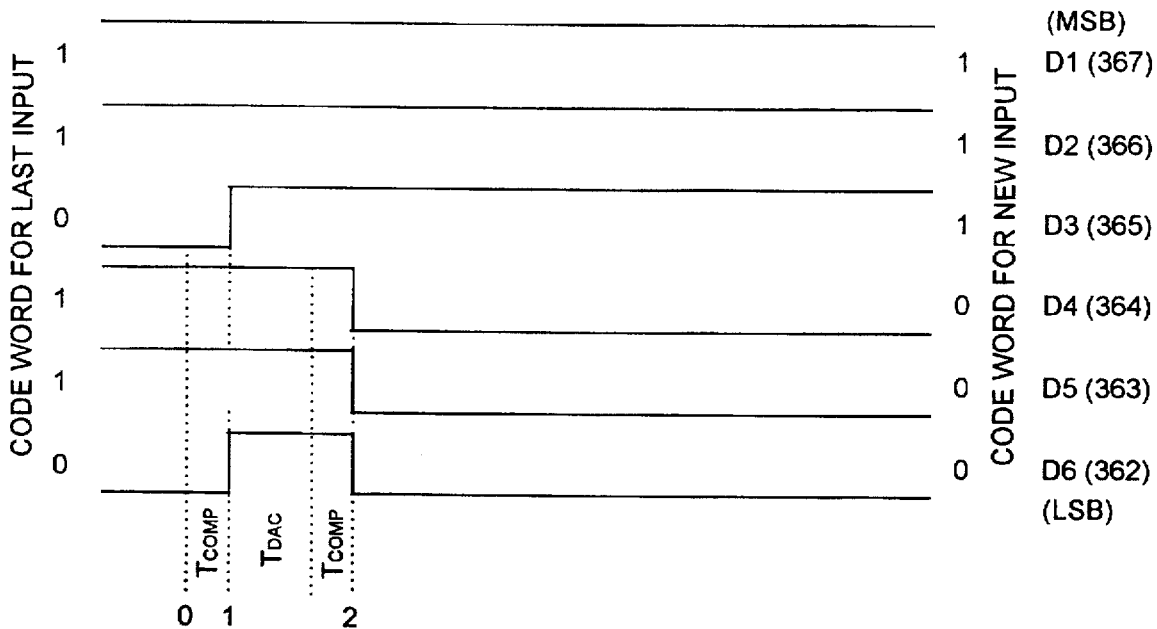
FIG. 9 is the timing diagram for the fifth case with respect to the varying-conversion-rate characteristic of the 6-bit DDSS A/D converter shown in FIG. 3.
Figure 10:
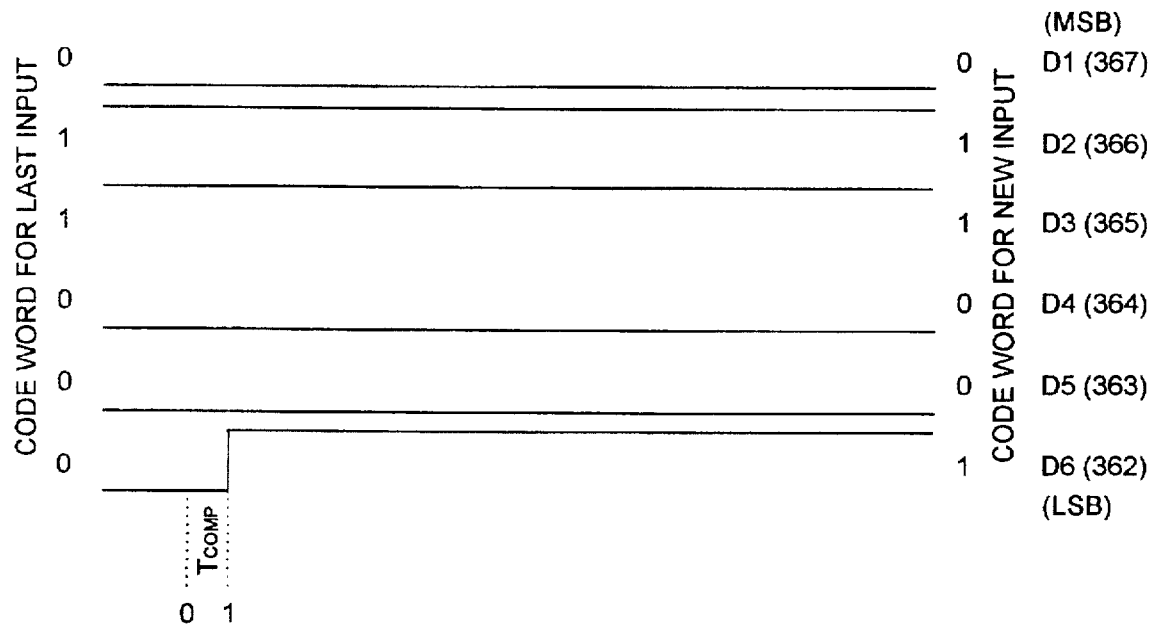
FIG. 10 is the timing diagram for the sixth case with respect to the varying-conversion-rate characteristic of the 6-bit DDSS A/D converter shown in FIG. 3.
Figure 11:
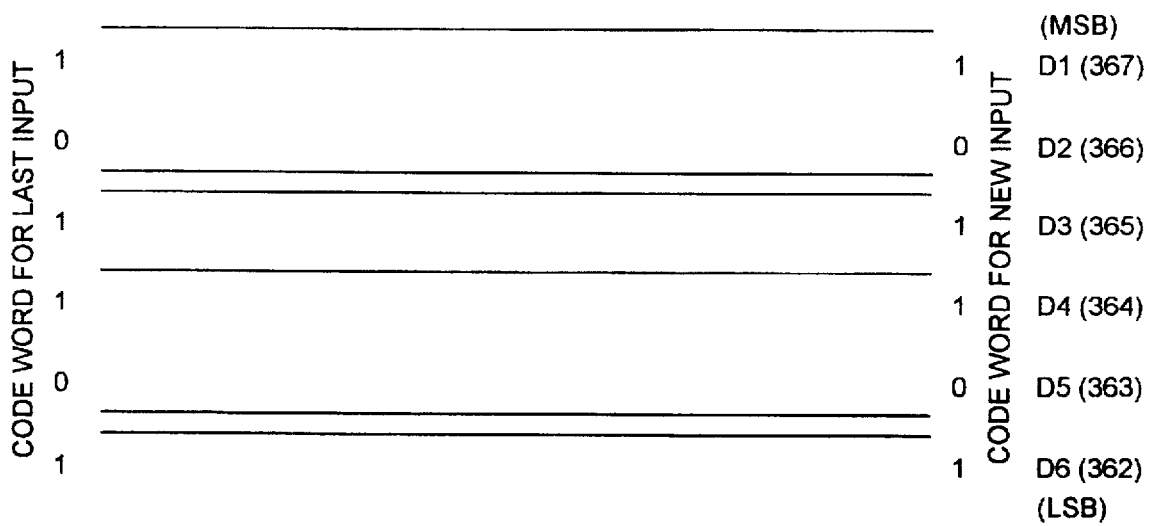
FIG. 11 is the timing diagram for the seventh case with respect to the varying-conversion-rate characteristic of the 6-bit DDSS A/D converter shown in FIG. 3.
Figure 12:
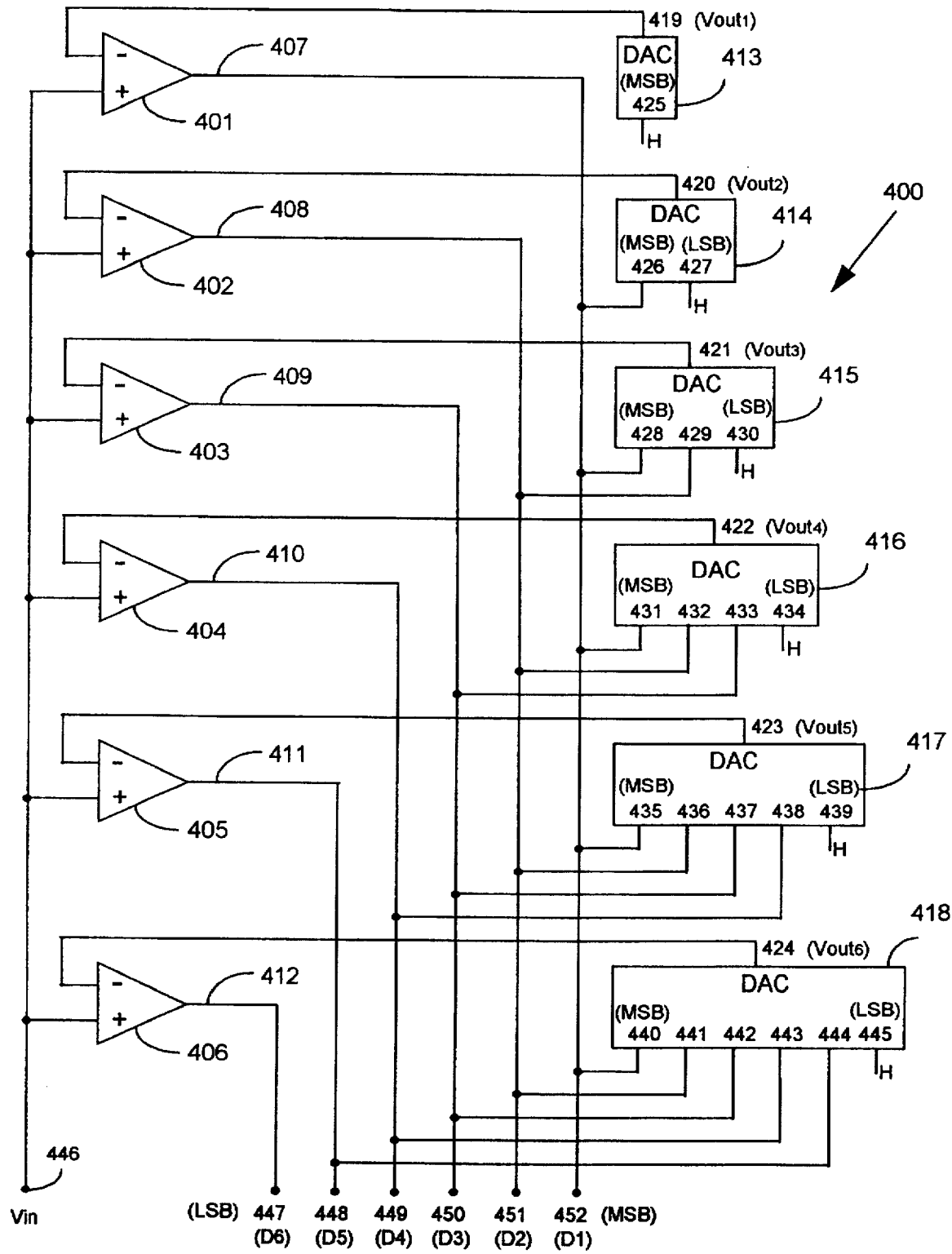
FIG. 12 is a functional diagram showing the basic structure of a 6-bit DDSS A/D converter with 6 internal voltage output DACs.
Figure 13:
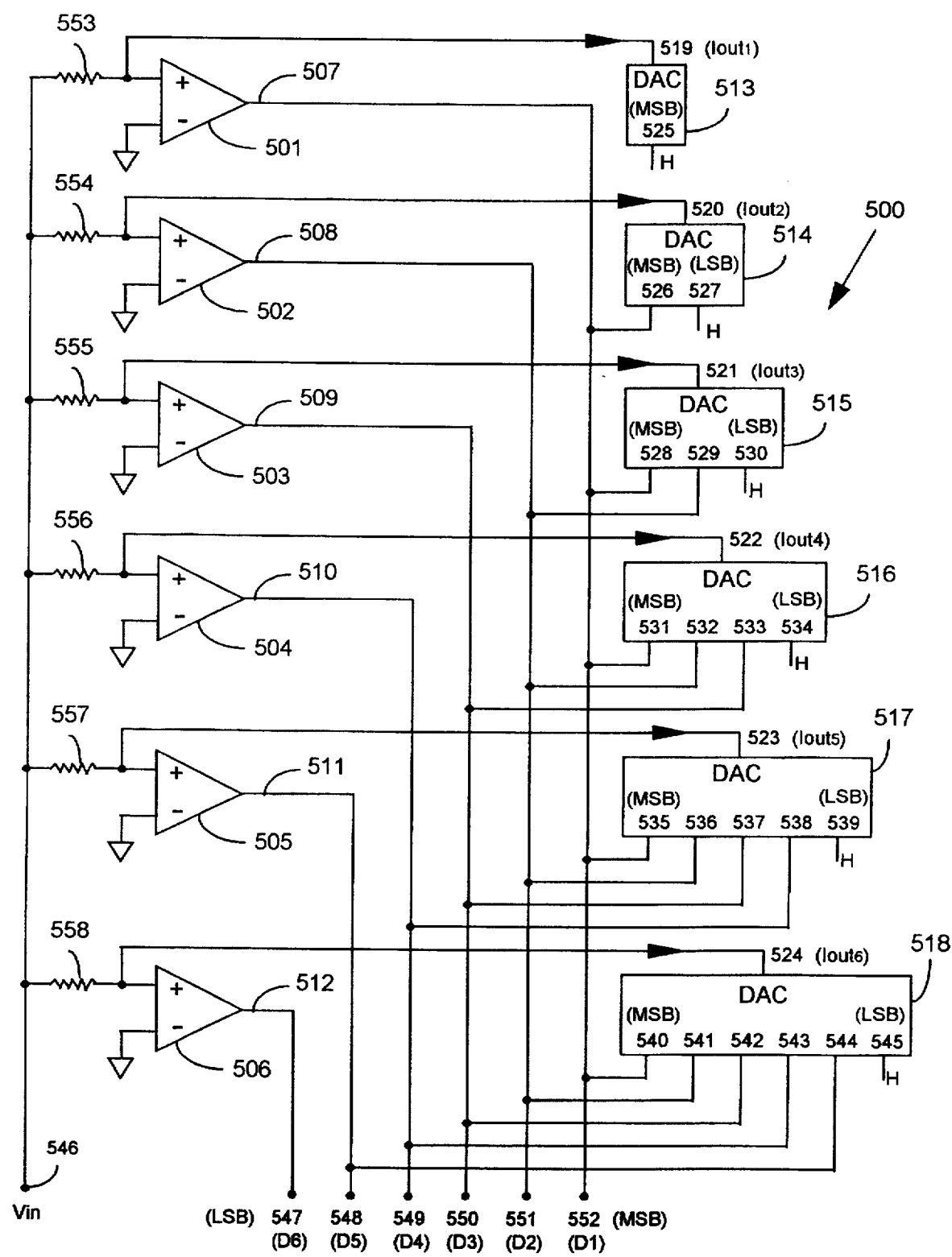
FIG. 13 is a functional diagram showing the basic structure of a 6-bit DDSS A/D converter with 6 internal current output DACs.

The present invention is an n-bit DDSS A/D converter. As previously discussed, a 6-bit direct-digitizing, self-stabilizing (DDSS) A/D converter is illustrated in FIG. 3. The 6-bit DDSS A/D converter 300 includes 6 identical internal 6-bit DACs, and 6 identical comparators. Note that some of the DAC input terminals are connected to constant logic low level, and therefore don't influence DAC outputs. These input terminals can be deleted functionally and structurally, thereby simplifying the circuit as shown in the functional diagram in FIG. 12. In FIG. 12, the six DACs have the same full-scale output, and have the same absolute accuracy (in terms of voltage), but have six different resolutions (ranging consecutively from a 1-bit DAC 413 to a 6-bit DAC 418). In FIG. 12, the DACs have voltage outputs. If the DACs have current outputs, the corresponding functional diagram is shown in FIG. 13. FIG. 13 is similar to FIG. 12, but has the following differences: each internal DAC provides its corresponding comparator with a current output instead of a voltage output; the inverting input terminal of each comparator is connected to ground potential; the output terminal of each DAC is connected to the non-inverting input terminal of a corresponding comparator; the analog input is connected to the non-inverting input of each comparator via a resistor of resistance R. Assuming that the full-scale output of each DAC is $I_{FS}$, then the full-scale range (FSR) of the DDSS A/D converter 500 is given by:

$$FSR = I_{FS}R \qquad \text{Equation 12}$$

At each comparator in FIG. 13, if $V_{in} > I_{out}R$, then the comparator output is a logic high level; otherwise, if $V_{in} < I_{out}R$, then the comparator output is a logic low level.

Figure 1:
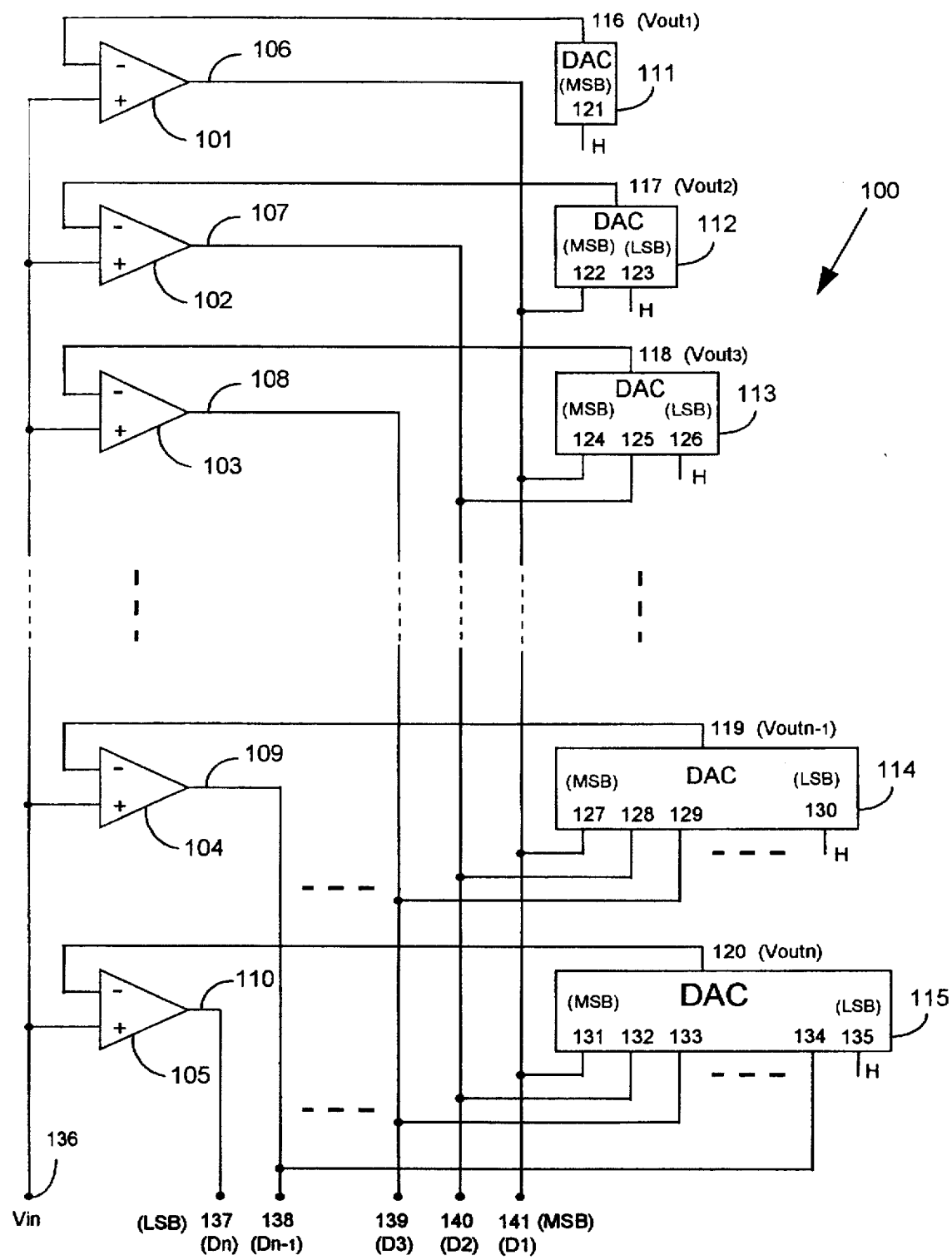
FIG. 1 is a functional diagram showing the generalized basic structure of an n-bit DDSS A/D converter with n internal voltage output DACs.

It is shown in FIG. 1 an n-bit DDSS A/D converter 100 with internal voltage output DACs. An n-bit, (n is an integer greater than 1), DDSS A/D converter 100 includes: n comparators each with a binary output, designated consecutively from a first comparator 101 to an n-th comparator 105; n internal DACs with the same full-scale output voltage, with the same absolute accuracy in terms of voltage, but with n different resolutions, ranging consecutively from a 1-bit DAC 111 to an n-bit DAC 115; and an terminal 136 for receiving an analog input signal, which is connected to the non-inverting input terminal of each comparator. The full-scale output of every internal DAC is corresponding to the full-scale range of the n-bit DDSS A/D converter 100. The n-bit A/D converter 100 is divisible into n stages, ranging consecutively from a first stage comprising the 1-bit DAC 111 and the first comparator 101, to an n-th stage comprising the n-bit DAC 115 and the n-th comparator 105. In each stage, the output terminal of an DAC is connected to an inverting input terminal of a comparator. The LSB input terminal of each DAC is functionally equivalent to being connected to a constant logic high level (for the 1-bit DAC 111, the MSB input terminal, 121, is also its LSB input terminal). A stable binary output (1 or 0) of the first comparator 101 can be used as D1, (MSB), of an A/D conversion output at 141, and is connected to every MSB input terminal B1, (122, 124, 127, 131), of the DACs in immediately subsequent stages. A stable binary output of the second comparator 102 can be used as the next most significant bit D2 of the A/D conversion output at 140, and is connected to every next-most-significant-bit input terminal B2, (125, 128, 132), of the DACs in immediately subsequent stages. And so forth. A stable binary output of the n-th comparator 105 can be used as Dn, (LSB), of the A/D conversion output at 137, but is not connected to any DAC.

Assume: the output of the 1-bit DAC 111 is denoted as Vouth, the output of the 2-bit DAC 112 is denoted as $V_{out2}$, ..., and the output of the n-bit DAC 115 is denoted as $V_{outn}$; and the full-scale output voltage of each DAC is denoted as $V_{FS}$. The following equations then apply:

$$V_{out1} = \frac{V_{FS}}{2} \qquad \text{Equation 13}$$

$$V_{out2} = V_{FS}\left(\frac{D_1}{2} + \frac{1}{2^2}\right)$$

$$V_{out3} = V_{FS}\left(\frac{D_1}{2} + \frac{D_2}{2^2} + \frac{1}{2^3}\right)$$

...

$$V_{outn} = V_{FS}\left(\frac{D_1}{2} + \frac{D_2}{2^2} + \frac{D_3}{2^3} + \ldots + \frac{1}{2^n}\right)$$

The 1-bit DAC 111 always provides a constant $V_{out1} = V_{FS}/2$ for the first comparator 101. If an input $V_{in}$ is applied: then at the first comparator 101, after $V_{in}$ and $V_{out1}$ are compared, a stable binary output D1 (MSB) is produced; then at the second comparator 102, after $V_{in}$ and $V_{out2}$ are compared, a stable D2 is produced; and so forth; finally, at the n-th comparator 105, after $V_{in}$ and $V_{outn}$ are compared, a stable Dn (LSB) is produced, which completes an A/D conversion.

Figure 14:
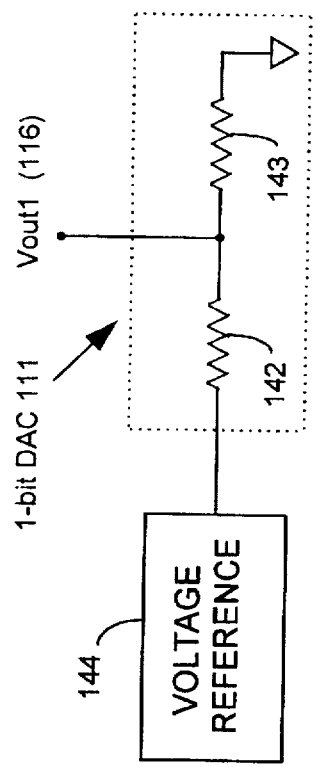
FIG. 14 is a block diagram illustrating one easy implementation of the internal 1-bit DAC of the DDSS A/D converter shown in FIG. 1.

One implementation of the 1-bit DAC 111 for the n-bit DDSS A/D converter 100 is shown in FIG. 14 wherein: a voltage reference 144 provides two resistors 142 and 143, which are of a same resistance and are connected in series, with a voltage that is equal to the full-scale output $V_{FS}$ of the 1-bit DAC 111. The DAC output $V_{out1}$, therefore, is always equal to one half of $V_{FS}$.

Figure 2:
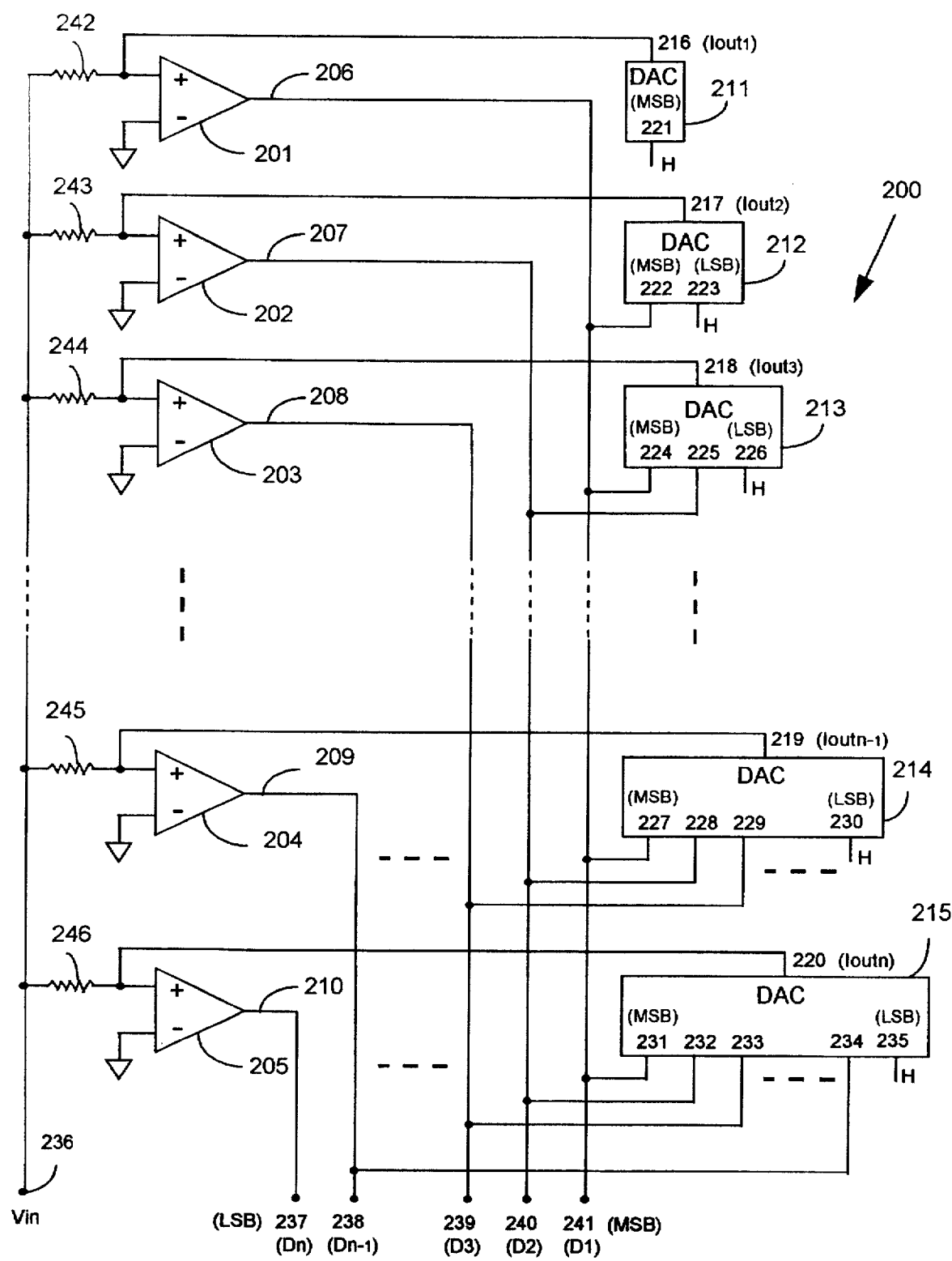
FIG. 2 is a functional diagram showing the generalized basic structure of an n-bit DDSS A/D converter with n internal current output DACs.

The basic structure for an n-bit DDSS A/D converter 200 with internal current output DACs is illustrated in FIG. 2. An n-bit, (n is an integer greater than 1), DDSS A/D converter 200 includes: n comparators each with a binary output, designated consecutively from a first comparator 201 to an n-th comparator 205; n internal DACs with the same full-scale output current, with the same absolute accuracy in terms of current, but with n different resolutions, ranging consecutively from a 1-bit DAC to an n-bit DAC 215; and a terminal 236 for receiving an analog input signal, which is connected to the non-inverting input terminal of each comparator via a resistor, (242–246 consecutively). The inverting input terminal of each comparator is connected to ground potential. The n-bit A/D converter 200 is divisible into n stages, ranging consecutively from a first stage comprising the 1-bit DAC 211 and the first comparator 201, to an n-th stage comprising the n-bit DAC 215 and the n-th comparator 205. The output terminal of each DAC is connected to the noninverting input terminal of the comparator of the same stage. The LSB input terminal of each DAC is functionally equivalent to being connected to a constant logic high level, (for the 1-bit DAC 211, the MSB input terminal is also its LSB input terminal). A stable binary output (1 or 0) of the first comparator 201 can be used as D1 (MSB) of an A/D conversion output at 241, and is connected to every MSB input terminal B1, (222, 224, 227, 231), of the DACs in immediately subsequent stages. A stable binary output of a second comparator 202 can be used as the next most significant bit D2 of the A/D conversion output at 240, and is connected to every next-most-significant-bit input terminal B2, (225, 228, 232), of the DACs in immediately subsequent stages. And so forth. A stable binary output of the n-th comparator 205 can be used as Dn (LSB) of the A/D conversion output at 237, but is not connected to any DAC.

Assume: the output of the 1-bit DAC 211 is denoted as $I_{out1}$, the output of the 2-bit DAC 212 is denoted as $I_{out2}$, ..., and the output of the n-bit DAC 215 is denoted as $I_{outn}$; the full-scale output of each DAC is denoted as $I_{FS}$. The following equations then apply:

$$I_{out1} = \frac{I_{FS}}{2} \qquad \text{Equation 14}$$

$$I_{out2} = I_{FS}\left(\frac{D_1}{2} + \frac{1}{2^2}\right)$$

$$I_{out3} = I_{FS}\left(\frac{D_1}{2} + \frac{D_2}{2^2} + \frac{1}{2^3}\right)$$

...

$$I_{outn} = I_{FS}\left(\frac{D_1}{2} + \frac{D_2}{2^2} + \frac{D_3}{2^3} + \ldots + \frac{1}{2^n}\right)$$

Resistors 242–246 are of the same resistance denoted as R. Then the full-scale range of the DDSS A/D converter is ($I_{FS}R$). The 1-bit DAC 211 always provides a constant $I_{out1} = I_{FS}/2$ for the first comparator 201. If an analog input $V_{in}$ is applied: then at the first comparator 201, after $V_{in}$ and ($I_{out1}R$) are compared, a stable binary output D1 (MSB) is produced; then at the second comparator 202, after $V_{in}$ and ($I_{out2}R$) are compared, a stable D2 is produced; and so forth; finally at the n-th comparator 205, after $V_{in}$ and ($I_{outn}R$) are compared, a stable Dn (LSB) is produced, which completes an A/D conversion.

To provide a stable analog input signal for an DDSS A/D converter as shown in FIG. 2, a preceding sample-hold amplifier is required to have enough current supply power to fit output current sources from all these internal DACs.

For an DDSS A/D converter, each LSB input terminal of its internal DACs is functionally equivalent to, but not necessarily being connected to a constant logic high level. For example, if the internal switch connected to a LSB input terminal is constantly turned on by some means, or if it is short-circuited and substituted by an equivalent resistance, its function to its DAC output remains the same; and consequently, each nominal LSB input terminal of an DDSS A/D converter can be left open.

All internal DACs in an DDSS A/D converter can use a common voltage reference.

Figure 20:
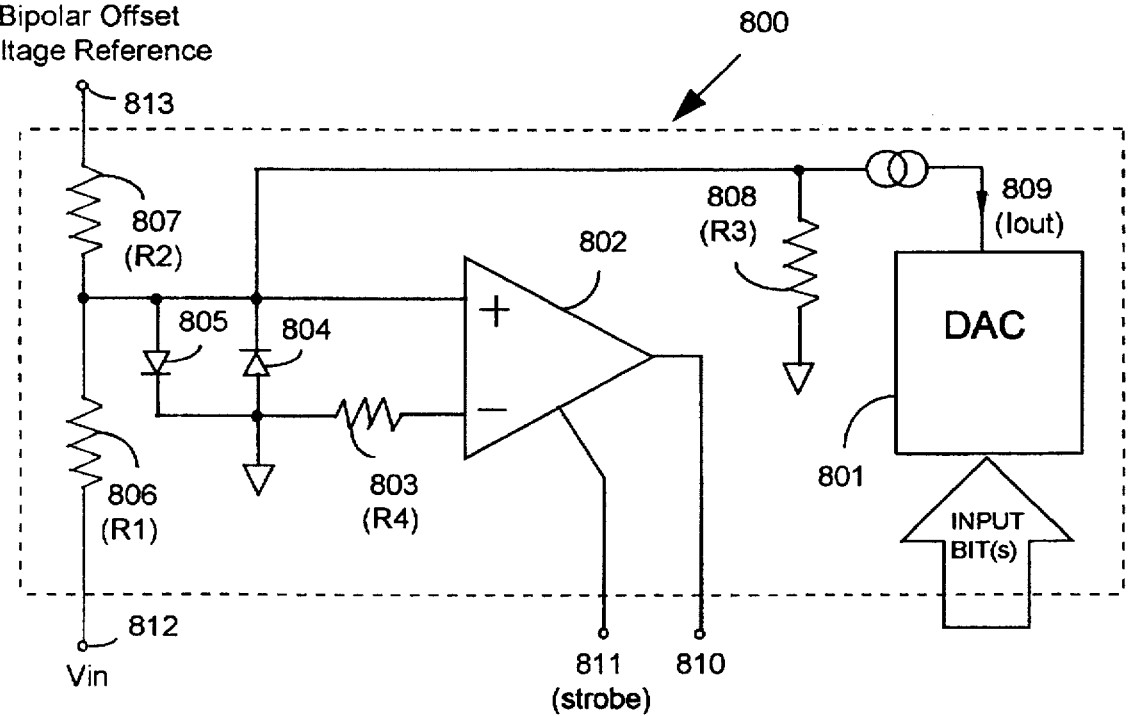
FIG. 20 shows implementation of one of the stages of an DDSS A/D converter with internal current-output DACs.

As shown in FIG. 20, in practice, in an DDSS A/D converter with internal current-output DACs (only one stage 800 is illustrated as an example), the inverting input terminal of an internal comparator 802 is usually not directly connected to ground potential, but via a resistor 803 (R4) for bias current compensation. And two diodes 804 and 805 are connected in parallel, but in opposite directions, between ground potential and the non-inverting input terminal of the comparator 802, thereby limiting the over-drive voltage at comparator input. In addition, there is usually a bypass resistor 808 (R3) connected between the non-inverting input terminal of the comparator 802 and ground potential, so as to provide a current path when there is no analog input at 812. This bypass resistor 808 is often built inside an DAC 801 block. If an analog input $V_{in}$ is bipolar, another resistor 807 (R2) is often added to provide bipolar offset voltage reference (at 813) to the non-inverting input terminal of the comparator 802, so that the equivalent voltage at the non-inverting input terminal is unipolar. One alternative approach to treating bipolar analog input signal is using bipolar-output DACs instead of unipolar-output DACs.

An analog input signal to an DDSS A/D converter mentioned throughout this description is assumed to be unipolar.

However, it is to be understood that since bipolar analog input signal can be conveniently transformed to equivalent unipolar analog input signal by publicly known techniques in data conversion (such as shown in FIG. 20), the present invention can be applied to any unipolar or bipolar analog input signal of appropriate magnitude.

Still referring to FIG. 20, if there are no diodes connected between the two input terminals of the comparator 802, and the terminal 813 is left open, and an positive analog input $V_{in}$ is added, the current source from the DAC 801 is $I_{out}$, then the voltage $V_+$ appearing at the non-inverting input terminal can be given by $$V_+ = \frac{R_3}{R_1 + R_3} (V_{in} - I_{out}R_1)$$   Equation 15

From Equation 15, we see that if $V_{in} > I_{out}R_1$, then $V_+$ is positive, and the output at 810 of the comparator 802 goes high; otherwise, if $V_{in} < I_{out}R_1$, $V_+$ is negative, and the output goes low.

Again, shown in FIG. 20, as an option, a strobe control terminal 811 can be added to each internal comparators: during an A/D conversion, the strobe control is disabled; upon the completion of the A/D conversion, the strobe control is enabled and latches each comparator output until a new A/D conversion starts. Thus, a last A/D conversion result can be kept at comparator outputs, so that internal DAC outputs are stable during an intermission of any two successive A/D conversions, which provides a hereditable basis for an immediately following A/D conversion. This kind of strobe control can also be applied to each comparator of an DDSS A/D converter with internal voltage-output DACs.

Figure 21:
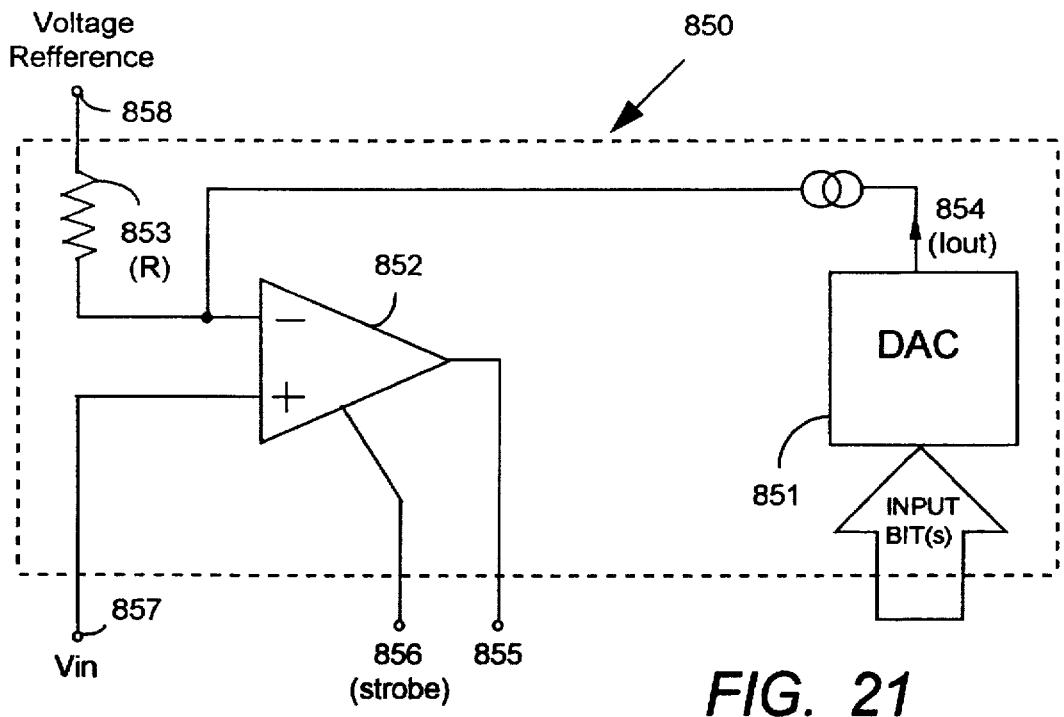
FIG. 21 shows an alternative approach to comparing an analog input and a reference provided by an DAC in one of the stages of an DDSS A/D converter with internal current-output DACs.
Figure 22:
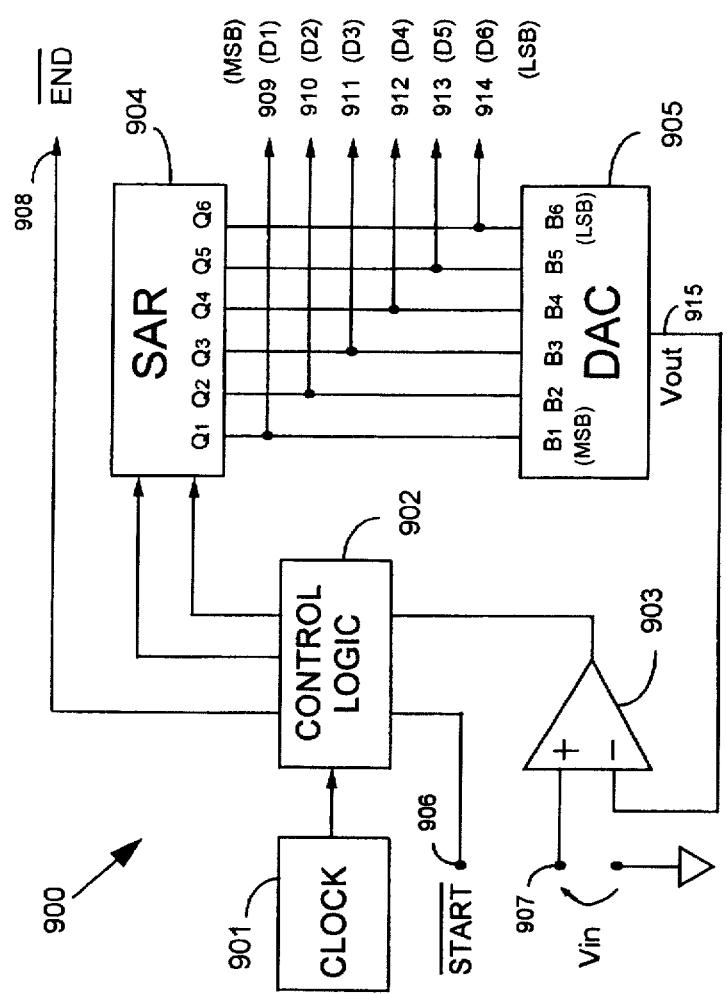
FIG. 22 is a block diagram showing a conventional 6-bit successive approximation A/D converter.
Figure 23:
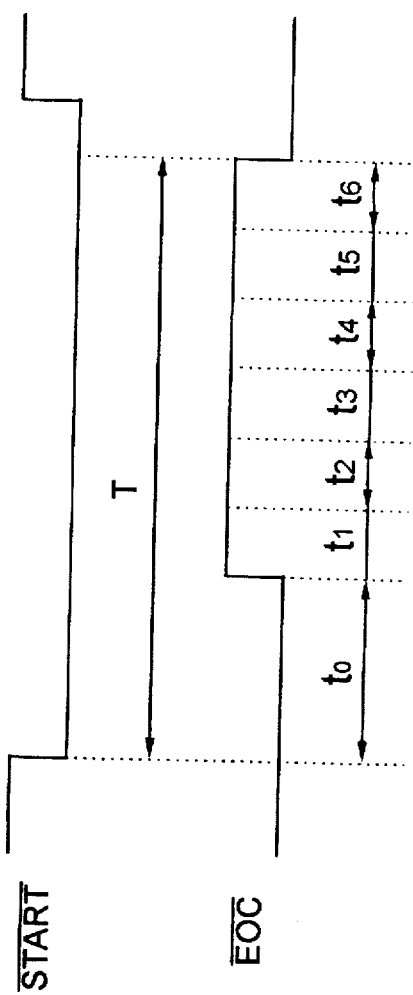
FIG. 23 is the timing diagram for the A/D converter shown in FIG. 22.
Figure 24:
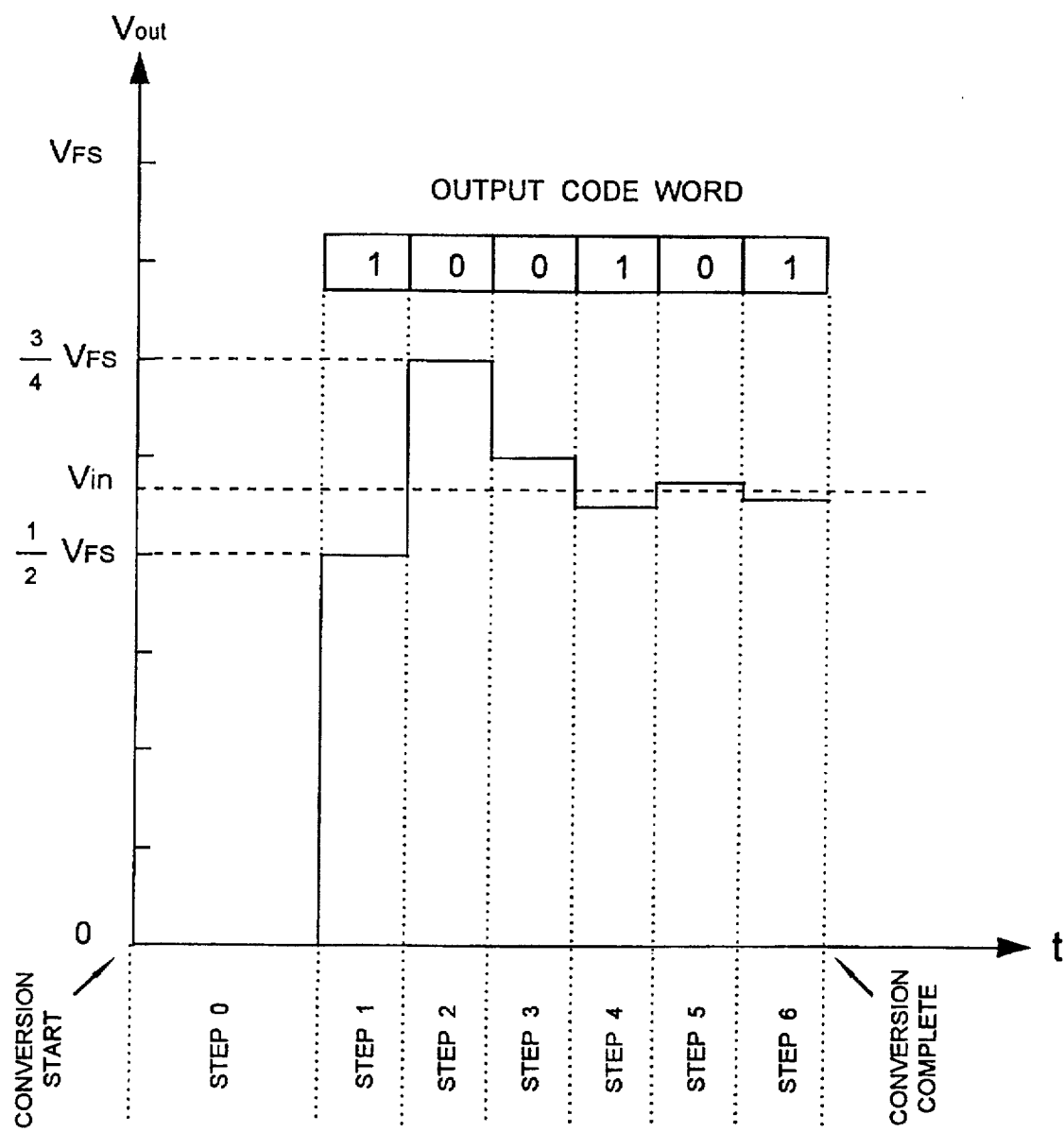
FIG. 24 is the representation of the successive approximation process for the A/D converter shown in FIG. 22.

In each stage of an DDSS A/D converter, an analog input signal and a reference provided by an DAC can be compared directly at a comparator, or can be summed up to get a difference, then compare the difference with ground potential at the comparator. The difference can be preamplified before it is compared with ground potential, thus providing sufficient over-drive voltage at comparator input to speed up comparator response. As an example, one stage 850 of an DDSS A/D converter with internal current-output DACS is shown in FIG. 21, where an analog input $V_{in}$ at 857 is compared directly, at a comparator 852, with a reference provided by an DAC 851. The output current source $I_{out}$ at 854 of the DAC 851 is connected to the inverting input terminal of the comparator 852, and is connected to a resistor 853 (R). The other end of the resistor 853 is connected to a voltage reference at 858: if an analog input at 857 is unipolar and positive, then the voltage reference provided is ground potential; if an analog input at 857 is bipolar, then the voltage reference provided is negative. The direction of output current source provided by the DAC 851 is from DAC 851 to resistor 853. The strobe control terminal 856 is optional. If an analog input $V_{in}$ at 857 is positive, and so terminal 858 is connected to ground potential, then: the output at 855 of the comparator 852 goes high if $V_{in} > I_{out}R$, or goes low if $V_{in} < I_{out}R$. The major advantage of this kind of configuration is that a preceding sample-hold amplifier of the DDSS A/D converter doesn't need to supply a considerable current for an analog input at 857.

Figure 15:
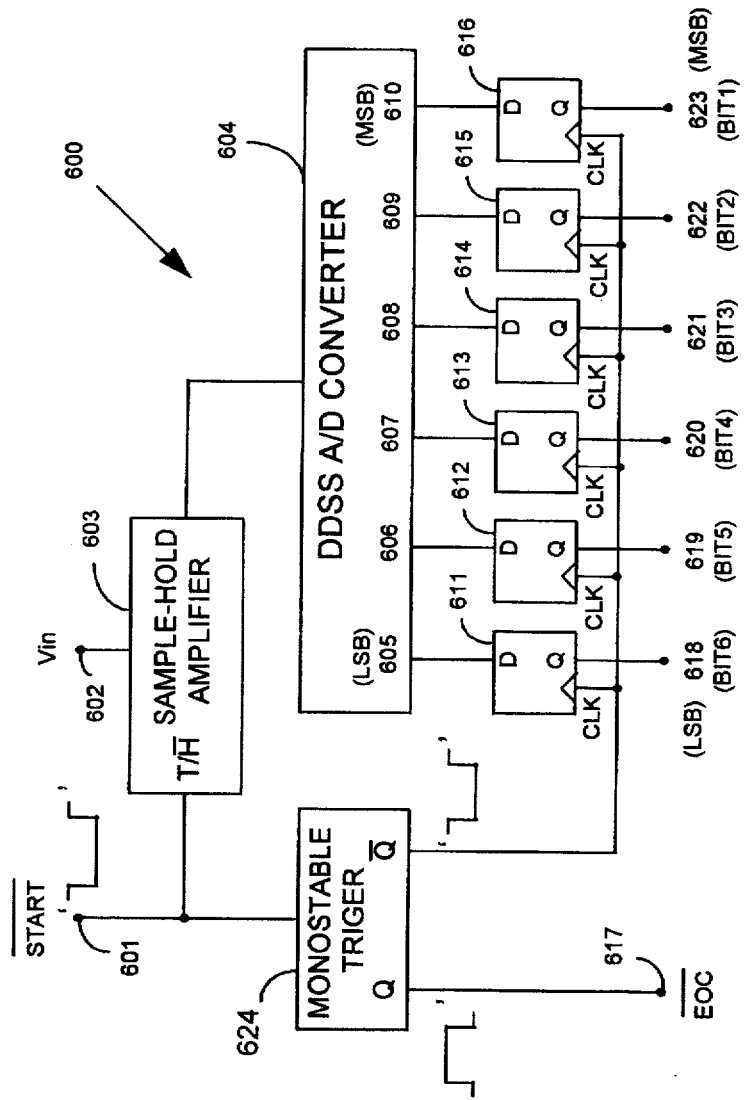
FIG. 15 is a block diagram of control logic used to run a basic 6-bit DDSS A/D converter at a constant A/D conversion rate.

To put an DDSS A/D converter into operation, some control logic must be added to the basic structure. For convenience of control, the conversion rate of an A/D converter is often made constant. A control logic for making the conversion rate of an DDSS A/D converter constant is shown in FIG. 15, where a 6-bit DDSS A/D converter 604 is used as an example. The A/D conversion output is latched by 6 type-D flip-flops, (611–616), which can be triggered by a rising edge. A monostable trigger 624 is used here as a time-delay component; and it has a non-inverting output terminal Q and an inverting output terminal $\overline{Q}$. A preceding sample-hold amplifier 603 provides input signal for the DDSS A/D converter 604.

Figure 16:
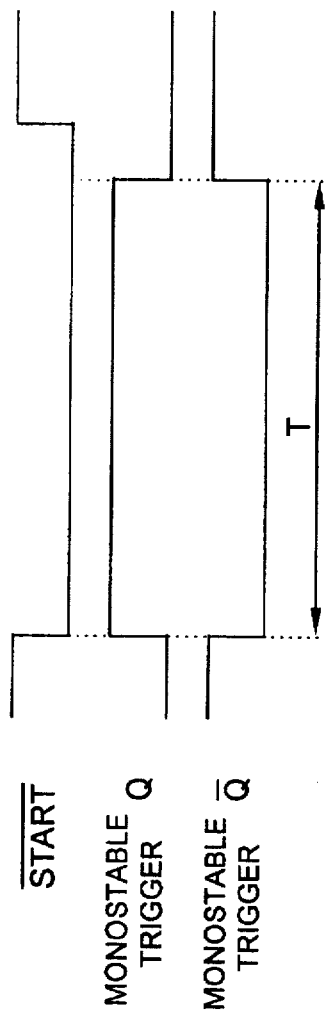
FIG. 16 is the timing diagram for the DDSS A/D converter with the control logic shown in FIG. 15.

The corresponding timing diagram is shown in FIG. 16. When a $\overline{START}$ signal is pulsed low, the sample-hold amplifier begins to hold an input signal; at the same time, the input signal is transferred to the DDSS A/D converter 604 where A/D conversion starts immediately; and Q, (provided as an $\overline{EOC}$ signal), of the monostable trigger 624 begins to rise, while $\overline{Q}$ begins to drop. The monostable period T of the monostable trigger 624 can be preset a little greater than the sum of the aperture and sample to hold settling time of the sample-hold amplifier 603 and the maximum A/D conversion time of the DDSS A/D converter 604. T is the constant A/D conversion time, its minimum value can be found by tests. When Q or $\overline{EOC}$ of the monostable trigger 624 begins to drop, it signals the end of an A/D conversion; at the same time, $\overline{Q}$ begins to rise, and the rising edge of $\overline{Q}$ triggers the 6 type-D flip-flops to latch an A/D conversion output from the DDSS A/D converter 604. Then a stable A/D conversion code word is available at the Q outputs, (618–623), of the 6 type-D flip-flops. Tristate buffers can be added after these type-D flip-flops to aid in computer interfacing.

Figure 17:
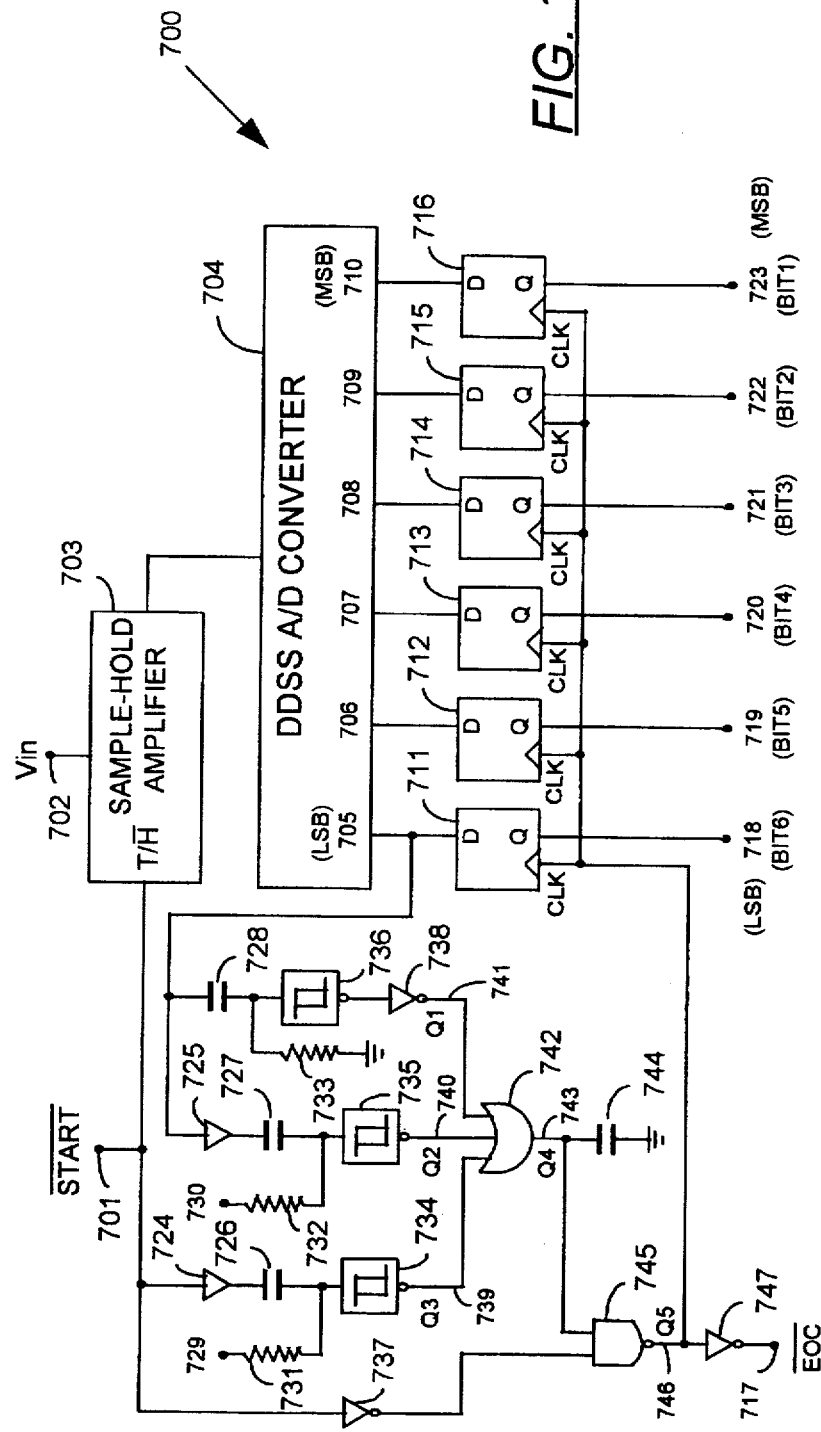
FIG. 17 is a block diagram of control logic used to run a basic 6-bit DDSS A/D converter at a varying conversion rate.
Figure 18:
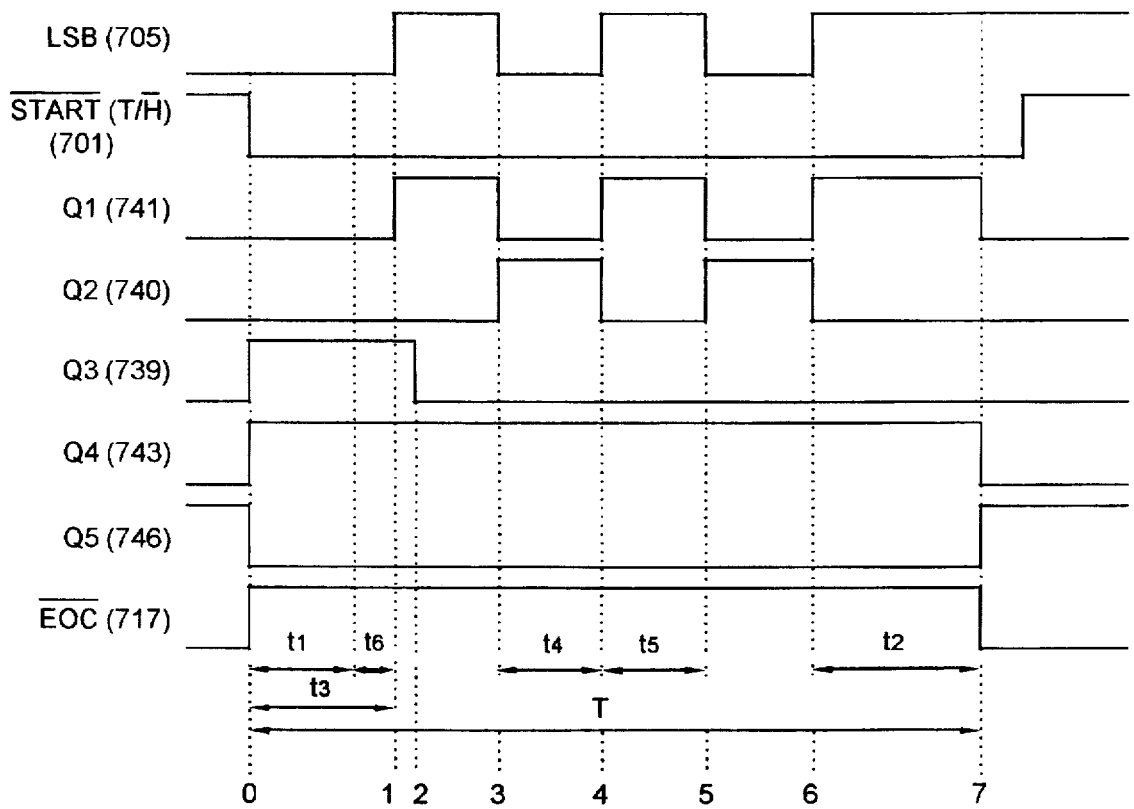
FIG. 18 is the timing diagram for the DDSS A/D converter with control logic shown in FIG. 17.
Figure 19:
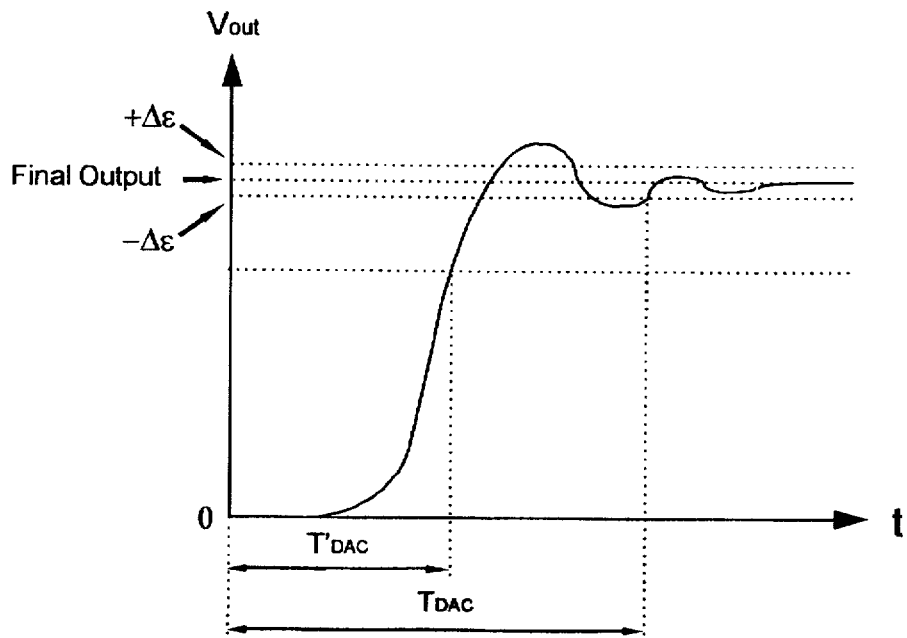
FIG. 19 illustrates the concept of settling time of an DAC and why an DDSS A/D converter can perform A/D conversion dynamically.

To exploit the maximum conversion rate an DDSS A/D converter can achieve, its varying-conversion-rate characteristic should be utilized as fully as possible. One circuit that can be used to realize this is shown in FIG. 17. The timing diagram for this circuit is shown in FIG. 18. This approach is based on the fact that the LSB output of an DDSS A/D converter is always the last bit to become stable. A preceding sample-hold amplifier provides analog input signal for a 6-bit DDSS A/D converter The conversion output of the A/D converter 704 is latched by 6 type-D flip-flops, (711–716), which can be triggered by a rising edge. A capacitor 728, a resistor 733 which is connected to ground potential, a Schmitt trigger 736, and an NOT gate 738 make up a monostable trigger, (called here as Monostable Trigger A, which can be triggered by the rising edge of a pulse). A capacitor 727, a resistor 732 which is connected to a positive digital power at 730, a Schmitt trigger 735, and a buffer 725, also make up a monostable trigger (called here as Monostable Trigger B, which can be triggered by the falling edge of a pulse). A capacitor 726, a resistor 731 which is also connected to a positive digital power, a Schmitt trigger 734, and a buffer 724, (called here as Monostable Trigger C, which can be triggered by the falling edge of a pulse).

The LSB of the A/D converter 704 is the triggering source for both Monostable Triggers A and B. An NOT gate 737 is used to suppress Q4 after a $\overline{START}$ signal is pulsed back high. Referring to FIG. 18, and assume that propagation time in the NOT gates, the buffers, the Schmitt triggers, OR gate 742, and NAND gate 745 is negligible. With these assumptions, then t1 is the aperture and sample to hold settling time of the sample-hold amplifier 703; t2 is the monostable period for both the Monostable Triggers A and B; t3 is the monostable period for the Monostable Trigger C; t4 or t5 is the total propagation time through an internal DAC and a comparator; t6 is the response time of a comparator; and T is the total A/D conversion time. The maximum value of t4 or t5 should be less than t2, and t3 should be greater than the sum of t1 and t6.

At time 0, the $\overline{START}$ signal is pulsed low, the sample-hold amplifier 703 begins to hold an analog input signal, the Monostable Trigger C is triggered and Q3 is pulsed high. At the same time, Q4 and $\overline{EOC}$ go high, while Q5 goes low.

At time 1, the Monostable Trigger A is triggered by a rising edge of the LSB output at 705, so Q1 goes high. At the same time, Q4 stays high.

At time 2, the monostable period of the Monostable Trigger C ends, so Q3 returns to a low. At the same time, Q4 keeps high.

At time 3, Q1 is pulsed low by a falling edge of the LSB output at 705 before the monostable period expires. At the same time: the Monostable Trigger B is triggered by the same falling edge, so Q2 goes high; and Q4 keeps high with the help of capacitor 744.

At time 4, the Monostable Trigger A is triggered again by another rising edge of the LSB output at 705, so Q1 goes high. At the same time: Q2 is pulsed back low by the same rising edge before the monostable period expires; and Q4 stays high.

At time 5, Q1 is pulsed back low by a falling edge of the LSB output at 705 before the monostable period expires. At the same time: the Monostable Trigger B is triggered by the same falling edge, so Q2 goes high; and Q4 stays high.

At time 6, the Monostable Trigger A is triggered again by a rising edge of the LSB output at 705, so Q1 goes high. At the same time: Q2 is pulsed back low by the same rising edge before the monostable period expires; and Q4 stays high.

At time 7, the monostable period of the Monostable Trigger A expires, so Q1 goes low. At the same time: Q4 goes low, while Q5 goes high, triggering the 6 type-D flip-flops to latch an A/D conversion output from the A/D converter 704; and an EOC signal goes low signaling the end of an A/D conversion; then a 6-bit code word is available at the Q outputs of the 6 type-D flip-flops. When there is no pulse from the LSB output at 705 after the $\overline{START}$ signal is pulsed low, it means that the equivalent code word for a new analog input remains unchanged compared with a last analog input. The Monostable Trigger C then forces the $\overline{EOC}$ signal to go low upon expiration of its monostable period. Tristate buffers can be added to the Q outputs of these type-D flip-flops for aiding in computer interfacing.

It is to be understood that the present invention is not limited to the sole embodiment described above, but encompasses any and all embodiments within the scope of the following claims.

I claim:

1. An n-bit analog to digital converter, wherein n is an integer greater than 1, comprising:

n comparator means, designated consecutively from a first comparator means to an n-th comparator means;

a terminal for receiving an analog input signal, said terminal being connected to each of said comparator means;

n internal voltage output digital to analog converter means with essentially the same full-scale output voltage corresponding to a full-scale range of said analog to digital converter, and with essentially the same absolute accuracy in terms of voltage, but with n essentially different resolutions, ranging consecutively from a 1-bit digital to analog converter means to an n-bit digital to analog converter means;

wherein said n-bit analog to digital converter is divisible into n stages, ranging consecutively from a first stage comprising said first comparator means and said 1-bit digital to analog converter means, to an n-th stage comprising said n-th comparator means and said n-bit digital to analog converter means; and wherein in each of said stages, a voltage output of one of said digital to analog converter means is provided as a reference voltage to one of said comparator means;

wherein the least-significant-bit input terminal of each of said digital to analog converter means is functionally equivalent to being connected to a constant logic high level;

wherein an output terminal of said first comparator means is essentially connected to every most-significant-bit input terminal of said digital to analog converter means in immediately subsequent stages, an output terminal of a second comparator means is essentially connected to every next-most-significant-bit input terminal of said digital to analog converter means in immediately subsequent stages, and so forth, with an exception that an output terminal of said n-th comparator means being not connected to any of said digital to analog converter means; and wherein a binary output of said first comparator means provides the most significant bit signal of an analog to digital conversion output, a binary output of said second comparator means provides the next most significant bit signal of said analog to digital conversion output, and so forth, a binary output of said n-th comparator means provides the least significant bit signal of said analog to digital conversion output.

2. The n-bit analog to digital converter of claim 1 wherein:

in each of said stages, an analog input signal is compared with, at one of said comparator means, a reference voltage provided by one of said digital to analog converter means, and producing, at an output terminal of the comparator means, a first binary signal whenever said analog input signal is greater than said reference voltage, or producing a second binary signal whenever said analog input signal is less than said reference voltage.

3. The n-bit analog to digital converter of claim 1 wherein:

in each of said stages, an analog input signal, and a reference voltage provided by one of said digital to analog converter means, are summed up to get a difference, then said difference is compared with ground potential at one of said comparator means, and producing, at an output terminal of the comparator means, a first binary signal whenever said difference is higher than ground potential, or producing a second binary signal whenever said difference is lower than ground potential.

4. The n-bit analog to digital converter of claim 3 wherein:

in each of said stages, said difference is preamplified before it is compared with ground potential.

5. The n-bit analog to digital converter of claim 2 wherein:

in each of said stages, one of said comparator means comprises a non-inverting input terminal and an inverting input terminal, said non-inverting input terminal means being connected to said terminal of analog input signal, said inverting input terminal being connected to an output terminal of one of said digital to analog converter means.

6. The n-bit analog to digital converter of claim 1 wherein: said 1-bit digital to analog converter means comprises two resistor means of substantially the same resistance, and designated as a first resistor means and a second resistor means, one terminal of said first resistor means being connected to a voltage reference means, another terminal of said first resistor means being connected to one terminal of said second resistor means and to an output terminal of said 1-bit digital to analog converter means, another terminal of said second resistor means being connected to ground potential.

7. The n-bit analog to digital converter of claim 1 wherein:
each of said comparator means includes a strobe terminal, which is disabled during an analog to digital conversion, and which is enabled during an intermission of any two successive analog to digital conversions.

8. The n-bit analog to digital converter of claim 1 wherein:
said n digital to analog converter means use a common voltage reference means.

9. The n-bit analog to digital converter of claim 1 wherein:
said n comparator means are essentially the same.

10. An n-bit analog to digital converter, wherein n is an integer greater than 1, comprising:

n comparator means, designated consecutively from a first comparator means to an n-th comparator means;

a terminal for receiving an analog input signal, said terminal being connected to each of said comparator means;

n internal current output digital to analog converter means with essentially the same full-scale current output corresponding to a full-scale range of said n-bit analog to digital converter, and with essentially the same absolute accuracy in terms of current, but with n essentially different resolutions, ranging consecutively from a 1-bit digital to analog converter means to an n-bit digital to analog converter means;

wherein said n-bit analog to digital converter is divisible into n stages, ranging consecutively from a first stage comprising said first comparator means and said 1-bit digital to analog converter means, to an n-th stage comprising said n-th comparator means and said n-bit digital to analog converter means; and wherein in each of stages, a current output of one of said digital to analog converter means is provided as an equivalent reference to one of said comparator means; and wherein the least-significant-bit input terminal of each of said digital to analog converter means is functionally equivalent to being connected to a logic high level; and wherein an output terminal of said first comparator means is essentially connected to every most-significant-bit input terminal of said digital to analog converter means in immediately subsequent stages, an output terminal of a second comparator means is essentially connected to every next-most-significant-bit input terminal of said digital to analog converter means in immediately subsequent stages, and so forth, with an exception that an output terminal of said n-th comparator means being not connected to any of said digital to analog converter means; and wherein a binary output of said first comparator means provides the most significant bit signal of an analog to digital conversion output, a binary output of said second comparator means provides the next most significant bit signal of said analog to digital conversion output, and so forth, a binary output of said n-th comparator means provides the least significant bit signal of said analog to digital conversion output.

11. The n-bit analog to digital converter of claim 10, wherein:
in each of said stages, an analog input signal is compared with, at one of said comparator means, an equivalent reference provided by one of said digital to analog converter means, and producing, at an output terminal of the comparator means, a first binary signal whenever said analog input signal is greater than said equivalent reference, or producing a second binary signal whenever said analog input signal is less than said equivalent reference.

12. The n-bit analog to digital converter of claim 10, wherein:
in each of said stages, an analog input signal, and an equivalent reference provided by one of said digital to analog converter means, are summed up to produce a difference, then said difference is compared with ground potential at one of said comparator means, and producing, at an output terminal of the comparator means, a first binary signal whenever said difference is higher than ground potential, or producing a second binary signal whenever said difference is lower than ground potential.

13. The n-bit analog to digital converter of claim 12, wherein:
in each of said stages, said difference is preamplified before it is compared with ground potential.

14. The n-bit analog to digital converter of claim 12, wherein:
in each of said stages, one of said comparator means comprises a non-inverting input terminal and an inverting input terminal, said non-inverting input terminal being connected to said terminal of analog input signal, said inverting input terminal being connected to an output terminal of one of said digital to analog converter means, and being connected to a terminal of a resistor means, another terminal of said resistor means being connected to a voltage reference means; and wherein when an analog input signal is unipolar and positive, said voltage reference means is ground potential; when an analog input signal is bipolar, said voltage reference means is negative.

15. The n-bit analog to digital converter of claim 11, wherein:
in each of said stages, one of said comparator means comprises a non-inverting input terminal and an inverting input terminal, said non-inverting input terminal being connected to an output terminal of one of said digital to analog converter means, and being connected to said terminal of analog input signal via a resistor means, said inverting input terminal being connected to ground potential directly or via another resistor means.

16. The n-bit analog to digital converter of claim 15, wherein:
each of said stages includes two diodes means connected in parallel, but in opposite directions, between a non-inverting terminal of one of said comparator means and ground potential.

17. The n-bit analog to digital converter of claim 15, wherein:
each of said resistor means connected to non-inverting input terminals is of substantially the same resistance, a full-scale range of said n-bit analog to digital converter being equal to the product of a full-scale output current of any of said digital to analog converter means and the resistance of any one of said resistor means.

18. The n-bit analog to digital converter of claim 15 wherein:

if an analog input voltage is bipolar, then in each of said stages, a non-inverting input terminals of one of said comparator means is connected to a terminal of a resistor means, another terminal of said resistor means being connected to a voltage reference means.

19. The n-bit analog to digital converter of claim 10, wherein:

each of said comparator means includes a strobe terminal, which is disabled during an analog to digital conversion, and which is enabled during an intermission of any two successive analog to digital conversions.

20. The n-bit analog to digital converter of claim 10 wherein:

said n digital to analog converter means use a common voltage reference means.

21. The n-bit analog to digital converter of claim 10 wherein:

said n comparator means are essentially the same.

* * * * *